United States Patent
Nakatsuka

(10) Patent No.: US 11,050,434 B2
(45) Date of Patent: Jun. 29, 2021

(54) DIGITAL-TO-ANALOG CONVERTER

(71) Applicant: Panasonic Intellectual Property Management Co., Ltd., Osaka (JP)

(72) Inventor: Junji Nakatsuka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/761,496

(22) PCT Filed: Nov. 14, 2018

(86) PCT No.: PCT/JP2018/042136
§ 371 (c)(1),
(2) Date: May 4, 2020

(87) PCT Pub. No.: WO2019/098239
PCT Pub. Date: May 23, 2019

(65) Prior Publication Data
US 2021/0167792 A1    Jun. 3, 2021

(30) Foreign Application Priority Data
Nov. 14, 2017   (JP) .............................. JP2017-218724

(51) Int. Cl.
*H03M 1/78*    (2006.01)
*H03M 1/76*    (2006.01)
*H03M 1/68*    (2006.01)

(52) U.S. Cl.
CPC ............... *H03M 1/76* (2013.01); *H03M 1/68* (2013.01)

(58) Field of Classification Search
CPC .................................. H03M 1/76; H03M 1/78
(Continued)

(56) References Cited

U.S. PATENT DOCUMENTS

| 5,969,657 A | 10/1999 | Dempsey et al. |
| 9,083,380 B2 * | 7/2015 | Price .................... H03M 1/002 |
| 2009/0309776 A1 | 12/2009 | Inoue et al. |

FOREIGN PATENT DOCUMENTS

| JP | H04-94220 A | 3/1992 |
| JP | H06-268523 A | 9/1994 |

(Continued)

OTHER PUBLICATIONS

Walt Kester, "Basic DAC Architectures III: Segmented DACs," Analog Devices, pp. 1-6, 2009.
(Continued)

*Primary Examiner* — Peguy Jean Pierre
(74) *Attorney, Agent, or Firm* — McDermott Will & Emery LLP

(57) ABSTRACT

A digital-to-analog converter includes: a first partial circuit with a first bank of resistors and a first group of switches; a second partial circuit; a first resistor; a third partial circuit with a third bank of resistors and a third group of switches; and a fourth partial circuit with a fourth bank of resistors and a fourth group of switches Supposing that the first resistor has a resistance value R, the fourth bank of resistors has a combined resistance value of $2^{(n-m)}R$, the first bank of resistors has a combined resistance value of $(2^m-1)R$, the third bank of resistors has a combined resistance value of $(2^m-1)R$, and the second partial circuit has a combined resistance value of $R/(2^{(n-m)}-1)$.

12 Claims, 17 Drawing Sheets

(58) Field of Classification Search
USPC .................................... 341/154, 148, 155
See application file for complete search history.

(56) References Cited

FOREIGN PATENT DOCUMENTS

| | | |
|---|---|---|
| JP | H09-294072 A | 11/1997 |
| JP | 2000-078014 A | 3/2000 |
| JP | 2003-309469 A | 10/2003 |
| JP | 3828667 B2 | 10/2006 |
| JP | 2009-302973 A | 12/2009 |

OTHER PUBLICATIONS

International Search Report issued in corresponding International Patent Application No. PCT/JP2018/042136, dated Feb. 12, 2019, with English translation.

* cited by examiner

DIGITAL-TO-ANALOG CONVERTER

CROSS-REFERENCE OF RELATED APPLICATIONS

The present application is the U.S. National Phase under 35 U.S.C. § 371 of International Application No. PCT/JP2018/042136, filed on Nov. 14, 2018, which claims the benefit of priority of Japanese Patent Application No. 2017-218724, filed on Nov. 14, 2017, the entire contents of which are incorporated herein by reference.

TECHNICAL FIELD

The present invention relates to a digital-to-analog converter (hereinafter referred to as a "DAC").

BACKGROUND ART

As is well known in the pertinent art, DACs are used in a broad variety of applications to convert an n-bit digital value into a corresponding analog signal.

For example, a bank of resistors, arranged by cascading $2n$ resistors, each having the same resistance value, between two terminals defining a reference voltage is used to divide the reference voltage between those resistors, and includes selector switches at all nodes of the resistors such that a potential at a node corresponding to an n-bit digital value is selectively output.

To reduce the number of parts and the installation area thereof, various types of segmented DACs have been designed. Suppose the number of bits, used for fine adjustment, among the n bits is m (where n and m are both integers). Such digital-to-analog converters are known from Patent Documents 1 and 2 and Non-Patent Document 1, for example.

According to these documents, a potential at a node, corresponding to a 6-bit digital value, of a bank of coarse adjustment resistors, where a plurality of resistors are cascaded for use in fine adjustment, is selected by a switch and output. The switch is ideally an ON-state resistance of 0Ω but actually has a finite ON-state resistance, which has some negative impact on the performance of DACs.

CITATION LIST

Patent Literature

Patent Document 1: U.S. Pat. No. 5,969,657 A
Patent Document 2: JP 3828667 B2
Non-Patent Document 1: Wall Kester, MT-16 TUTORIAL, "Basic DAC Architectures III: Segmented DACs," ANALOG DEVICES

SUMMARY OF INVENTION

It is therefore an object of the present invention to provide a digital-to-analog converter with improved DAC performance by taking the ON-state resistance of a switch into account.

A digital-to-analog converter according to an aspect of the present disclosure is implemented as a digital-to-analog converter of n bits including m bits for fine adjustment where m is a positive integer and n is an integer larger than m. The digital-to-analog converter includes a first partial circuit, a second partial circuit, a first resistor, a third partial circuit, and a fourth partial circuit. The first partial circuit has a first terminal and a second terminal. A high-side reference potential is applied to the first terminal. The second partial circuit has a third terminal and a fourth terminal. The third terminal is electrically connected to the second terminal. The first resistor has a fifth terminal and a sixth terminal. The fifth terminal is electrically connected to the fourth terminal. The third partial circuit has a seventh terminal and an eighth terminal. The seventh terminal is electrically connected to the sixth terminal. A low-side reference potential is applied to the eighth terminal. The fourth partial circuit has a ninth terminal, a tenth terminal, and an eleventh terminal. The ninth terminal is electrically connected to the third terminal. The tenth terminal is electrically connected to the sixth terminal. An analog signal is output through the eleventh terminal. The fourth partial circuit includes a fourth bank of resistors and a fourth group of switches. The fourth bank of resistors is constituted of $2^{(n-m)}$ resistors that are connected together in series between the ninth terminal and the tenth terminal. The fourth group of switches is constituted of $2^{(n-m)}$ switches configured to electrically connect every node of the fourth bank of resistors, but a node located closer to the ninth terminal than any other node of the fourth bank of resistors, to the eleventh terminal in response to a digital signal. The first partial circuit includes a first bank of resistors and a first group of switches. The first bank of resistors is constituted of $2^m-1$ resistors that are connected together in series between the first terminal and the second terminal. The first group of switches is constituted of $2^m$ switches configured to electrically connect $2^m$ nodes of the first bank of resistors to the first terminal in response to the digital signal. The third partial circuit includes a third bank of resistors and a third group of switches. The third bank of resistors is constituted of $2^m-1$ resistors that are connected together in series between the seventh terminal and the eighth terminal. The third group of switches is constituted of $2^m$ switches configured to electrically connect $2^m$ nodes of the third bank of resistors to the eighth terminal in response to the digital signal. When the first resistor has a resistance value R, the fourth bank of resistors has a combined resistance value of $2^{(n-m)}R$, the first bank of resistors has a combined resistance value of $(2^m-1)R$, the third bank of resistors has a combined resistance value of $(2^m-1)R$, and the second partial circuit has a combined resistance value of $R/(2^{(n-m)}-1)$.

A digital-to-analog converter according to another aspect of the present disclosure is implemented as a digital-to-analog converter of n bits including m bits for fine adjustment where m is a positive integer and n is an integer larger than m. The digital-to-analog converter includes a first partial circuit, a second partial circuit, a first resistor, a third partial circuit, and a fourth partial circuit. The first partial circuit has a first terminal and a second terminal. A high-side reference potential is applied to the first terminal. The second partial circuit has a third terminal and a fourth terminal. The third terminal is electrically connected to the second terminal. The first resistor has a fifth terminal and a sixth terminal. The fifth terminal is electrically connected to the fourth terminal. The third partial circuit has a seventh terminal and an eighth terminal. The seventh terminal is electrically connected to the sixth terminal. A low-side reference potential is applied to the eighth terminal. The fourth partial circuit has a ninth terminal, a tenth terminal, and an eleventh terminal. The ninth terminal is electrically connected to the fifth terminal. The tenth terminal is electrically connected to the sixth terminal. An analog signal is output through the eleventh terminal. The fourth partial circuit includes a fourth bank of resistors and a fourth group of switches. The fourth bank of resistors is constituted of $2^{(n-m)}-1$ resistors that are connected together in series between the ninth terminal and the tenth terminal. The fourth group of switches is constituted of $2^{(n-m)}$ switches configured to electrically connect $2^{(n-m)}$ nodes of the fourth bank of resistors to the eleventh terminal in response to a digital signal. The first partial circuit includes a first bank of resistors and a first group of switches. The first bank of resistors is constituted of $2^m-1$ resistors that are connected together in series between the first terminal and the second terminal. The first group of switches is constituted of $2^m$ switches configured to electrically connect $2^m$ nodes of the first bank of resistors to the first terminal in response to the digital signal. The third partial circuit includes a third bank of resistors and a third group of switches. The third bank of resistors is constituted of $2^m-1$ resistors that are connected together in series between the seventh terminal and the eighth terminal. The third group of switches is constituted of $2^m$ switches configured to electrically connect $2^m$ nodes of the third bank of resistors to the eighth terminal in response to the digital signal. When the first resistor has a resistance value R, the fourth bank of resistors has a combined resistance value of $(2^{(n-m)}-1)R$, the first bank of resistors has a combined resistance value of $(2^m-1)R$, the third bank of resistors has a combined resistance value of $(2^m-1)R$, and the second partial circuit has a combined resistance value of $R/(2^{(n-m)})$.

DESCRIPTION OF EMBODIMENTS

Figure 1:
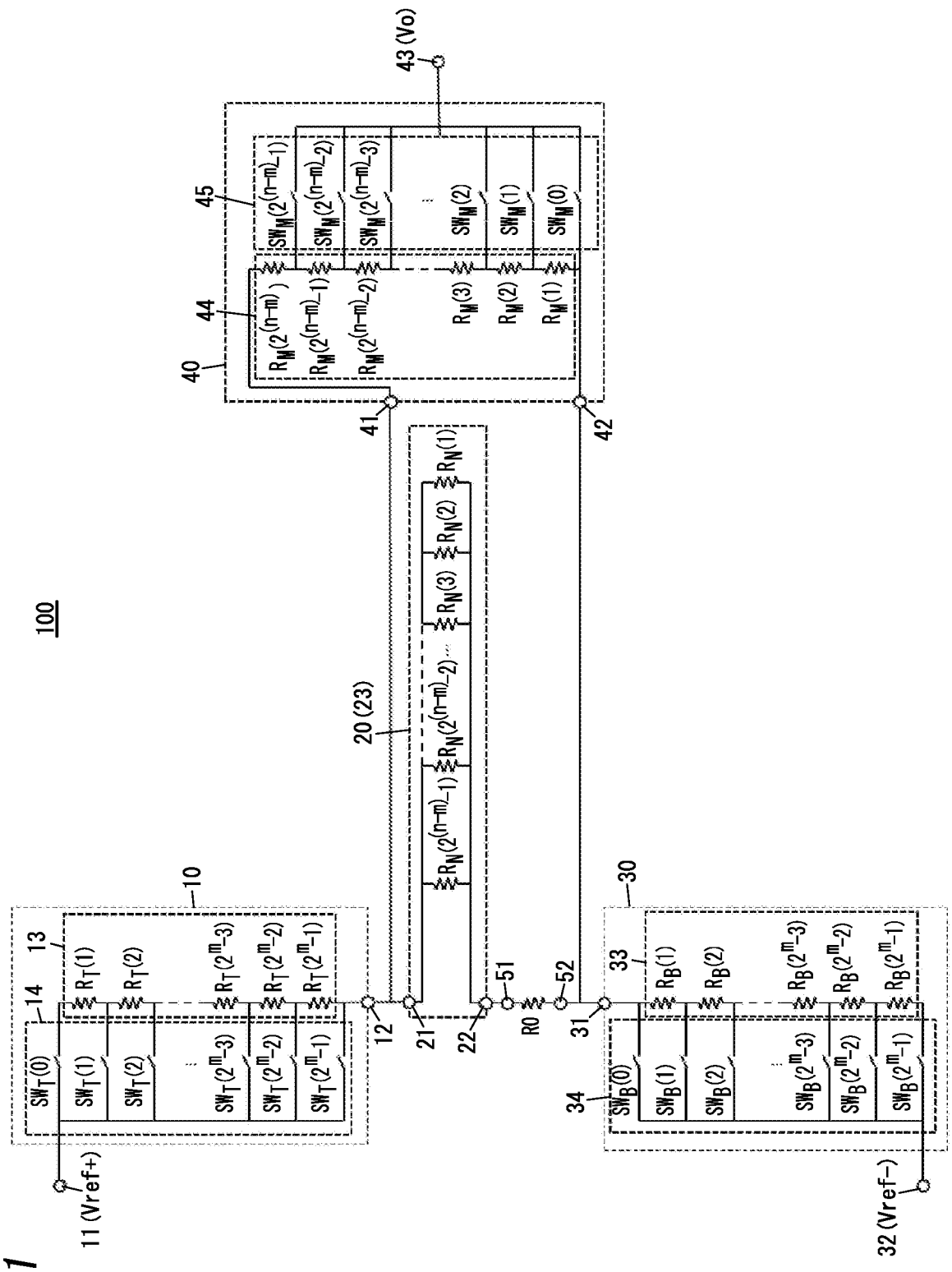
FIG. 1 is a circuit diagram of a digital-to-analog converter according to a first exemplary embodiment.

Embodiments of a digital-to-analog converter will be described with reference to the accompanying drawings. In the drawings, constituent elements having substantially the same function are designated by the same reference sign, and description of substantially the same constituent element will be omitted herein to avoid redundancies. Optionally, respective constituent elements of the various embodiments to be described below may also be used in any combination unless there is any contradiction between them.

First Embodiment

A digital-to-analog converter 100 according to a first exemplary embodiment will be described with reference to the accompanying drawings.

FIG. 1 illustrates a circuit diagram of the digital-to-analog converter 100 according to the first exemplary embodiment.

The digital-to-analog converter 100 according to the first exemplary embodiment is an n-bit DAC, and the number of bits for use in fine adjustment is m. Thus, the number of bits for use in coarse adjustment is (n−m).

The digital-to-analog converter 100 includes a first partial circuit 10, a second partial circuit 20, a third partial circuit 30, a fourth partial circuit 40, and a first resistor R0 (reference resistor). The first partial circuit 10 has a first terminal 11 and a second terminal 12. The second partial circuit 20 has a third terminal 21 and a fourth terminal 22. The first resistor R0 has a fifth terminal 51 and a sixth terminal 52. The third partial circuit 30 has a seventh terminal 31 and an eighth terminal 32. The fourth partial circuit 40 has a ninth terminal 41, a tenth terminal 42, and an eleventh terminal 43. A high-side reference potential Vref+ is applied to the first terminal 11 of the first partial circuit 10. The second terminal 12 of the first partial circuit 10 is electrically connected to the third terminal 21 of the second partial circuit 20 and the ninth terminal 41 of the fourth partial circuit 40. The fourth terminal 22 of the second partial circuit 20 is electrically connected to the fifth terminal 51 of the first resistor R0. The sixth terminal 52 of the first resistor R0 is electrically connected to the seventh terminal 31 of the third partial circuit 30 and the tenth terminal 42 of the fourth partial circuit 40. A low-side reference potential Vref− is applied to the eighth terminal 32 of the third partial circuit 30. An output voltage Vo specified by a digital signal is output as an analog signal through the eleventh terminal 43 of the fourth partial circuit 40.

The second partial circuit 20 includes a second bank of resistors 23, which is constituted of $2^{(n-m)}-1$ resistors $R_N(1)$ to $R_N(2^{(n-m)}-1)$ that are connected together in parallel between the third terminal 21 and the fourth terminal 22. The combined resistance value of the second bank of resistors 23 is $1/(2^{(n-m)}-1)$ of the resistance value of the first resistor R0.

The fourth partial circuit 40 includes a fourth bank of resistors 44 and a fourth group of switches 45. The fourth bank of resistors 44 is constituted of $2^{(n-m)}$ resistors $R_M(1)$ to $R_M(2^{(n-m)})$ that are connected together in series between the ninth terminal 41 and the tenth terminal 42. The fourth group of switches 45 includes $2^{(n-m)}$ switches $SW_M(0)$ to $SW_M(2^{(n-m)}-1)$ configured to electrically connect respective nodes of the fourth bank of resistors 44 to the eleventh terminal 43 in response to a digital signal. As used herein, the "nodes" include a point of connection between two resistors that form a bank of resistors and the two terminals of the bank of resistors. Specifically, the $2^{(n-m)}$ switches $SW_M(0)$ to $SW_M(2^{(n-m)}-1)$ are electrically connected between all of the $2^{(n-m)}$ nodes of the $2^{(n-m)}$ resistors $R_M(1)$ to $R_M(2^{(n-m)})$, but the node located closest to the ninth terminal 41 (including the point of connection of the fourth bank of resistors 44 to the tenth terminal 42) and the eleventh terminal 43. The switches $SW_M(0)$ to $SW_M(2^{(n-m)}-1)$ turn ON and OFF in response to a digital signal. The combined resistance value of the fourth bank of resistors 44 is $2^{(m-n)}$ times the resistance value of the first resistor R0.

The first partial circuit 10 includes a first bank of resistors 13 and a first group of switches 14. The first bank of resistors 13 is constituted of $2^m-1$ resistors $R_T(1)$ to $R_T(2^m-1)$ that are connected together in series between the first terminal 11 and the second terminal 12. The first group of switches 14 includes $2^m$ switches $SW_T(0)$ to $SW_T(2^m-1)$ configured to electrically connect the nodes of the first bank of resistors 13 to the first terminal 11 in response to the digital signal. Specifically, the $2^m$ switches $SW_T(0)$ to $SW_T(2^m-1)$ are electrically connected between the $2^m$ nodes of the $2^m-1$ resistors $R_T(1)$ to $R_T(2^m-1)$ (including the two terminals of the first bank of resistors 13) and the first terminal 11. The $2^m$ switches $SW_T(0)$ to $SW_T(2^m-1)$ turn ON and OFF in response to a digital signal. The combined resistance value of the first bank of resistors 13 is $2^m-1$ times the resistance value of the first resistor R0.

The third partial circuit 30 includes a third bank of resistors 33 and a third group of switches 34. The third bank of resistors 33 is constituted of $2^m-1$ resistors $R_B(1)$ to $R_B(2^m-1)$ that are connected together in series between the seventh terminal 31 and the eighth terminal 32. The third group of switches 34 includes $2^m$ switches $SW_B(0)$ to $SW_B(2^m-1)$ configured to electrically connect the nodes of the third bank of resistors 33 to the eighth terminal 32 in response to the digital signal. Specifically, the $2^m$ switches $SW_B(0)$ to $SW_B(2^m-1)$ are electrically connected between the $2^m$ nodes of the $2^m-1$ resistors $R_B(1)$ to $R_B(2^m-1)$ (including the two terminals of the third bank of resistors 33) and the eighth terminal 32. The $2^m$ switches $SW_B(0)$ to $SW_B(2^m-1)$ turn ON and OFF in response to a digital signal. The combined resistance value of the third bank of resistors 33 is $2^m-1$ times the resistance value of the first resistor R0.

The digital-to-analog converter 100, having such a configuration, provides improved DAC performance. In the following description, before the digital-to-analog converter 100 is described, a known digital-to-analog converter 200 will be described. Following is information the present inventors collected about a problem with the known digital-to-analog converter 200.

Figure 2:
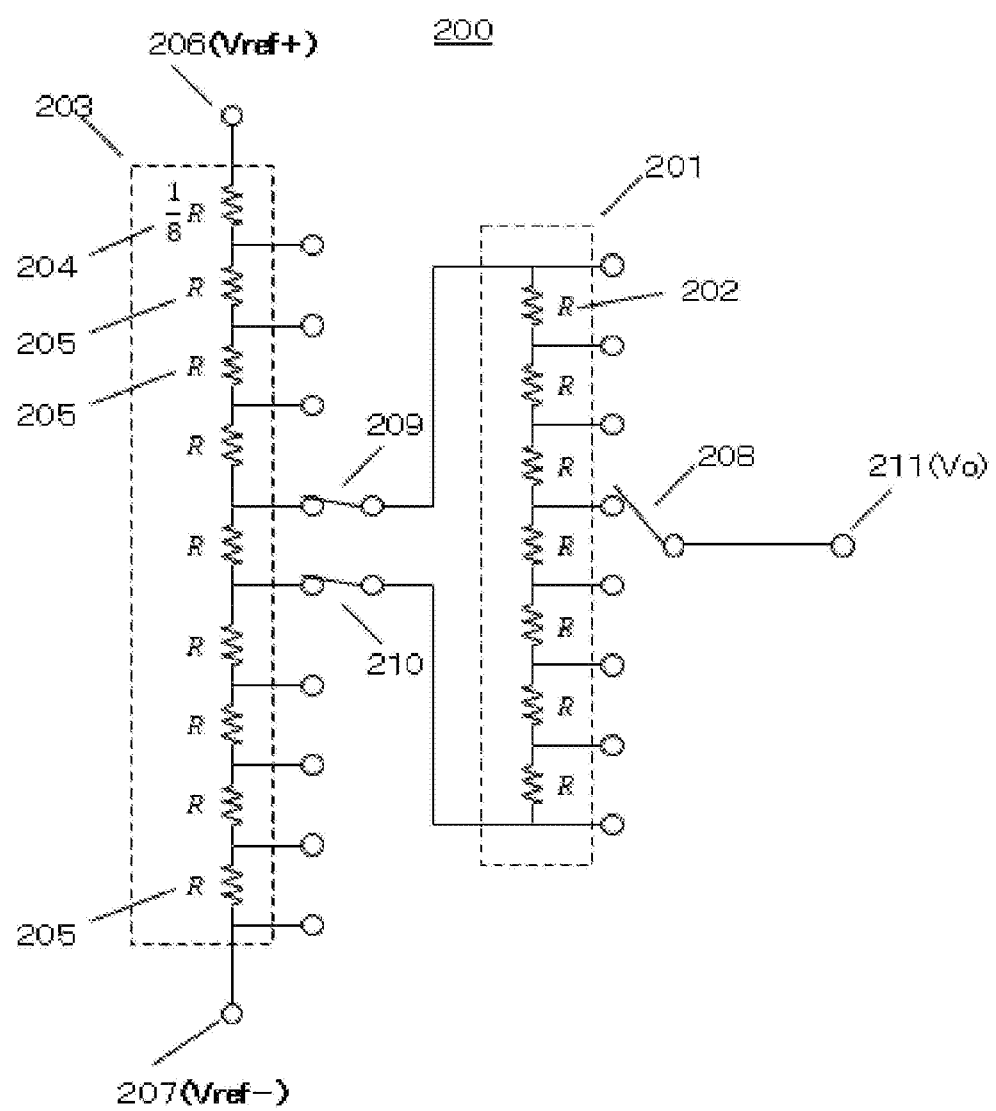
FIG. 2 is a circuit diagram schematically illustrating a known digital-to-analog converter.

FIG. 2 schematically illustrates, for reference purposes, a circuit diagram of the known digital-to-analog converter 200 disclosed in Non-Patent Document 1. The converter 200 illustrated in FIG. 2 is a 6-bit DAC, i.e., n=6. The number of bits for use in fine adjustment is three, i.e., m=3. Thus, the number of bits for use in coarse adjustment is three, i.e., n−m=6−3=3. In this case, the fine adjustment bank of resistors 201 is formed by connecting seven resistors 202 ($2^m-1=2^3-1=7$) together in series. In the coarse adjustment bank of resistors 203, one resistor 204, of which the resistance value is ⅛ (=½³) of the resistance value of the resistors 202 that form the fine adjustment bank of resistors 201, and eight (=$2^{(n-m)}=2^{(6-3)}=2^3$) resistors 205, of which the resistance value is equal to the resistance value of the resistors 202 that form the fine adjustment bank of resistors 201, are cascaded together. A high-side reference potential Vref+ is applied to one terminal 206 of a resistor 204 with a small resistance value, and a low-side reference potential Vref− (e.g., a ground potential of 0 V) is applied to the other terminal 207 of the bank of eight resistors 205 cascaded together. A potential at a node corresponding to a 6-bit digital value is selected through switches 208-210 so that an output voltage Vo is delivered through a terminal 211.

In this case, the switches 208-210 ideally have an ON-state resistance of 0Ω but actually have a finite ON-state resistance. The switch 208 is connected to an input terminal of an operational amplifier OP with high input impedance, and therefore, the ON-state resistance of the switch 208 is not a problem. Meanwhile, the switches 209 and 210 are connected to the fine adjustment bank of resistors 201 and the coarse adjustment bank of resistors 203. Thus, the ON-state resistance of the switches 209 and 210 does affect the performance of the DAC.

Figure 3:
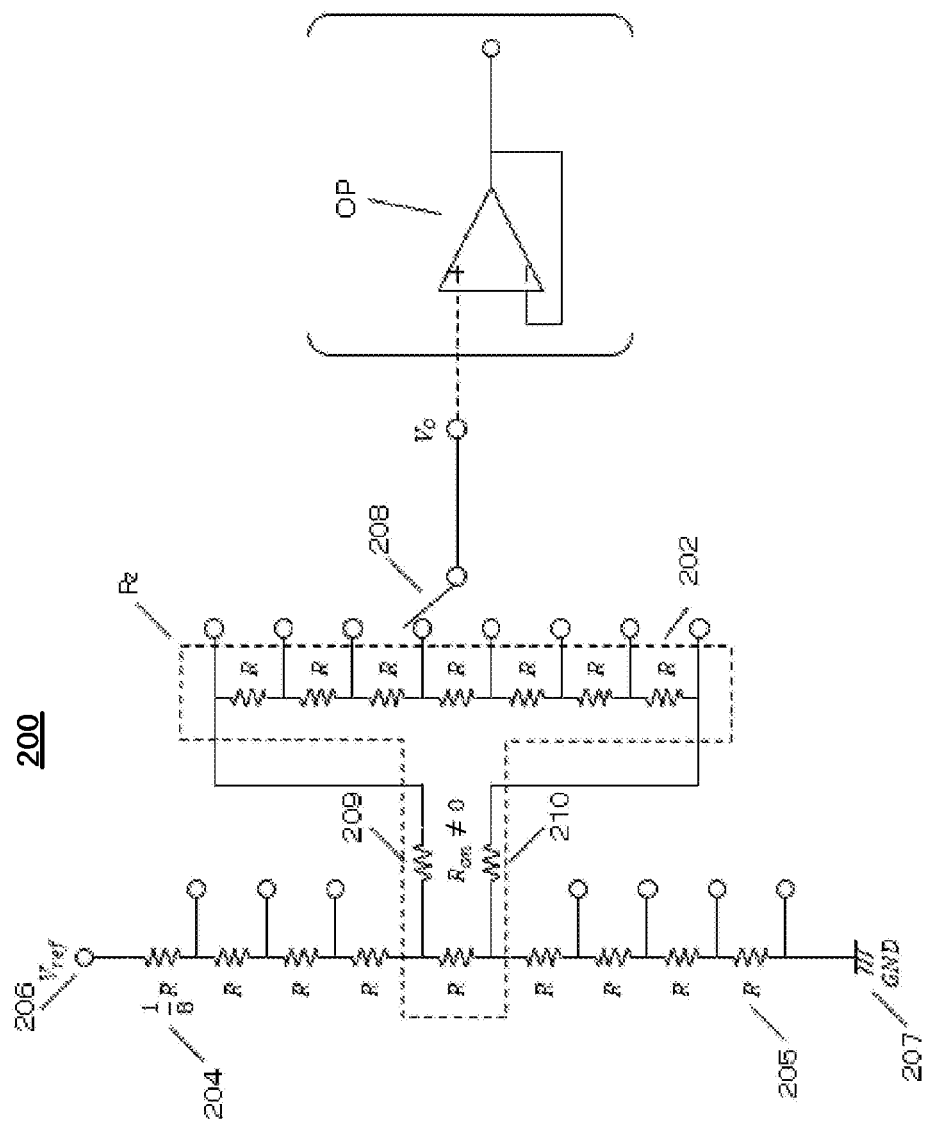
FIG. 3 is a circuit diagram of the digital-to-analog converter.

FIG. 3 illustrates a circuit diagram of a circuit in which the switches 209 and 210 connected to the fine adjustment bank of resistors 201 and the coarse adjustment bank of resistors 203 have a finite ON-state resistance. In this example, a six-bit digital value is designated by p, the digital value of three most significant bits for use in coarse adjustment of the six-bit digital value is designated by q, the fine-adjustment digital value of three least significant bits for use in fine adjustment of the six-bit digital value is designated by r, and the ON-state resistance of the switches 209 and 210 is designated by Ron.

In the following description, n=6 is supposed to be satisfied. If the 6-bit binary number of n=6 is represented by $[100100]_2$, then the 6-bit digital value p, the digital value q for coarse adjustment, and the digital value r for fine adjustment are given by the following Equations (1)-(3), respectively:

[Equation 1]
$$p=[100100]_2=36 \tag{1}$$

[Equation 2]
$$q=[100]_2=4 \tag{2}$$

[Equation 3]
$$r=[100]_2=4 \tag{3}$$

First, the combined resistance Rz of a parallel circuit formed by a series circuit of the fine adjustment bank of resistors 201, the switches 209 and 210, and one resistor 205 of the coarse adjustment bank of resistors 203 as shown in FIG. 3 is given by the following Equation (4):

[Equation 4]
$$Rz = \cfrac{1}{\cfrac{1}{R_{on}+7R+R_{on}}+\cfrac{1}{R}} = \cfrac{7R+2R_{on}}{8R+2R_{on}} \times R = \cfrac{7}{8}R + \cfrac{2R_{on}}{8R+2R_{on}} \times \cfrac{R}{8} \tag{4}$$

Thus, the output voltage Vo is given by the following Equation (5):

[Equation 5]
$$V_o = p \times \frac{V_{ref}}{64} + \left(8-2q-\frac{2p}{64}\right) \times \frac{R_{on}}{8R+2R_{on} \times \frac{65}{64}} \times \frac{V_{ref}}{64} \tag{5}$$

Therefore, if the integral nonlinearity error is abbreviated as INL, then the INL is given by the following Equation (6):

[Equation 6]

$$INL = \left(8 - 2q - \frac{2p}{64}\right) \times \frac{R_{on}}{8R + 2R_{on} \times \frac{65}{64}} \times \frac{V_{ref}}{64} \quad (6)$$

Figure 4:
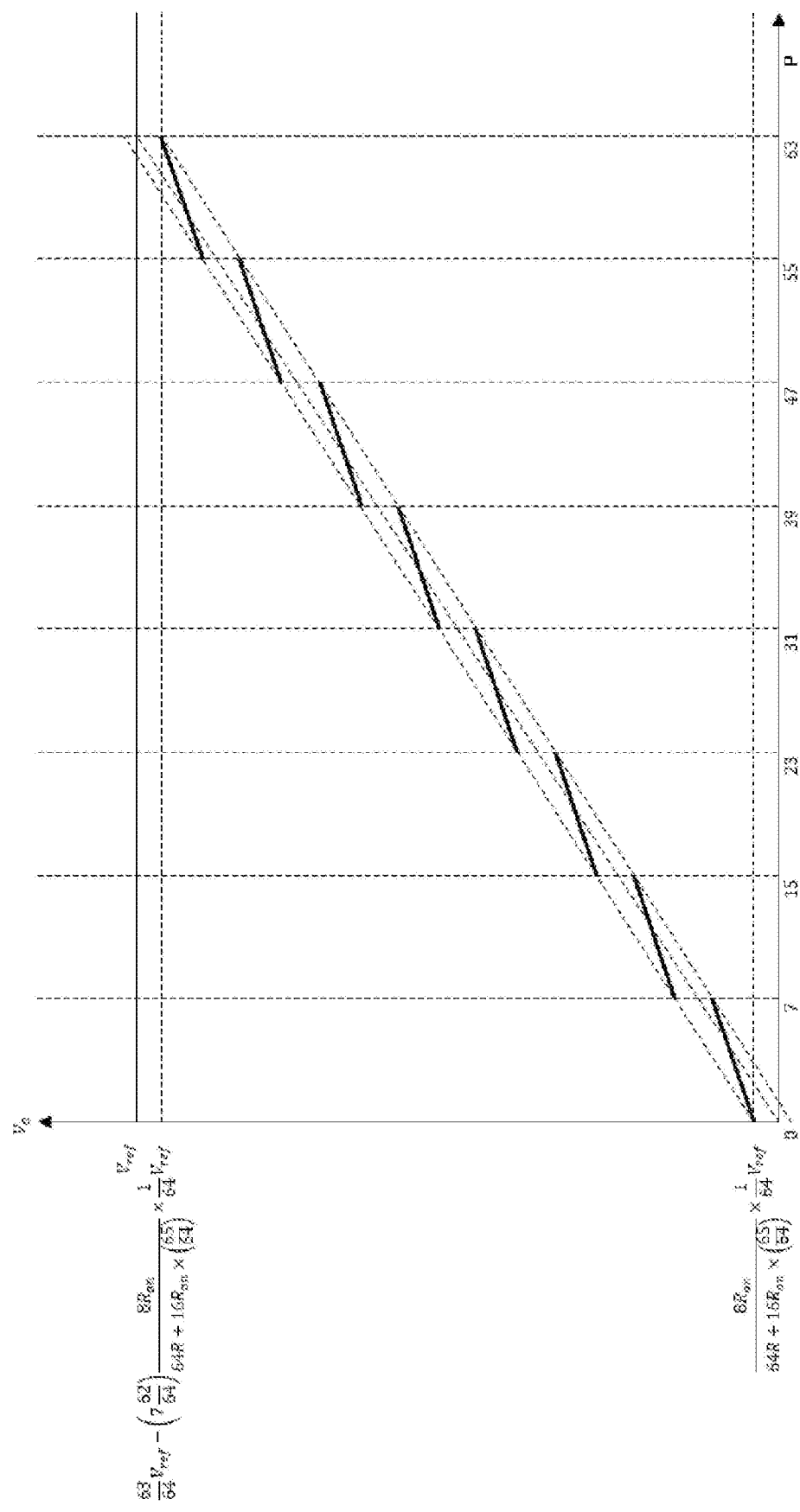
FIG. 4 is a graph showing how a 6-bit digital value changes with the output voltage of the digital-to-analog converter.
Figure 5:
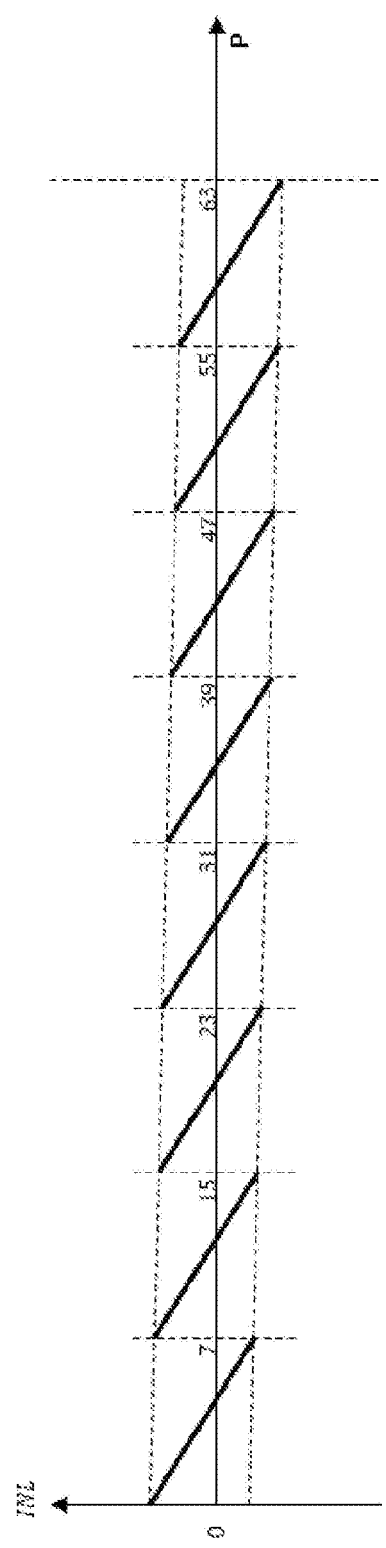
FIG. 5 is a graph showing how a 6-bit digital value changes with the integral nonlinearity error INL of the digital-to-analog converter.

FIG. 4 is a graph showing how the 6-bit digital value changes with the output voltage Vo. FIG. 5 is a graph showing how the 6-bit digital value changes with the integral nonlinearity error INL. FIG. 4 is a graphic representation of Equation (5), in which the ordinate indicates the output voltage Vo and the abscissa indicates the 6-bit digital value p. FIG. 5 is a graphic representation of Equation (6), in which the ordinate indicates the integral nonlinearity error INL and the abscissa indicates the 6-bit digital value p.

As can be seen, considering the ON-state resistance of the switches 209 and 210, the integral nonlinearity error INL has a saw-tooth waveform decreasing diagonally downward right, thus causing a decline in DAC performance.

In contrast, the digital-to-analog converter 100 according to the first exemplary embodiment achieves improvement in DAC performance over the known digital-to-analog converter 200 by curbing the decline in the DAC performance. This point will be described in detail.

First, the combined resistance Rz of the second partial circuit 20, the fourth partial circuit 40, and the first resistor R0 is calculated by the following Equation (7):

[Equation 7]

$$R_z = \cfrac{1}{\cfrac{1}{\cfrac{1}{\sum_{i=1}^{2^{(n-m)}-1} \cfrac{1}{R_{N(i)}}} + R0} + \cfrac{1}{\sum_{i=1}^{2^{(n-m)}-1} R_{m(i)}}} \quad (7)$$

In this case, suppose the resistors $R_N(1)$ to $R_N(2^{(n-m)}-1)$ that form the second partial circuit 20, the first resistor R0, and the resistors $R_M(1)$ to $R_M(2^{(n-m)})$ that form the fourth partial circuit 40 all have the same resistance value R for the sake of simplicity. That is to say, the respective resistance values of each resistor $R_N(i)$ of the second partial circuit 20, the first resistor R0, and each resistor $R_M(i)$ of the fourth partial circuit 40 satisfy the following Equation (8), where i is an integer falling within the range from 1 to $2^{(n-m)}-1$:

[Equation 8]

$$R0 = R_{N(i)} = R_{M(i)} = R \quad (8)$$

Equation (7) may be modified, using this Equation (8), into the following Equation (9):

[Equation 9]

$$R_z = \cfrac{1}{\cfrac{1}{\cfrac{R}{2^{(n-m)}-1} + R} + \cfrac{1}{2^{(n-m)} \times R}} = \quad (9)$$

$$\cfrac{1}{\cfrac{1}{\cfrac{2^{(n-m)}-1}{2^{(n-m)} \times R} + \cfrac{1}{2^{(n-m)} \times R}}} = \cfrac{2^{(n-m)} \times R}{2^{(n-m)}} = R$$

Likewise, suppose the resistors $R_T(1)$ to $R_T(2^m-1)$ that form the first partial circuit 10 and the resistors $R_B(1)$ to $R_B(2^m-1)$ that form the third partial circuit 30 in FIG. 1 all have the same resistance R. That is to say, the respective resistance values of each resistor $R_T(i)$ of the first partial circuit 10 and each resistor $R_B(i)$ of the third partial circuit 30 satisfy the following Equation (10), where i is an integer falling within the range from 1 to $2^m-1$:

[Equation 10]

$$R0 = R_{N(i)} = R_{M(i)} = R_{T(i)} = R_{B(i)} = R \quad (10)$$

According to Equation (10), the combined resistance Rz of the first resistor R0 and the second bank of resistors 23 has the same resistance value as each of the resistors $R_T(1)$ to $R_T(2^m-1)$ that form the first bank of resistors 13 and each of the resistors $R_B(1)$ to $R_B(2^m-1)$ that form the third bank of resistors 33. Thus, the interval, subjected to the coarse adjustment, between the first terminal 11 to which the high-side reference potential Vref+ is applied and the eighth terminal 32 to which the low-side reference potential Vref− is applied is divided into equal potentials. Likewise, the interval, subjected to the fine adjustment, of the fourth bank of resistors 44 is also divided into equal potentials.

Figure 6:
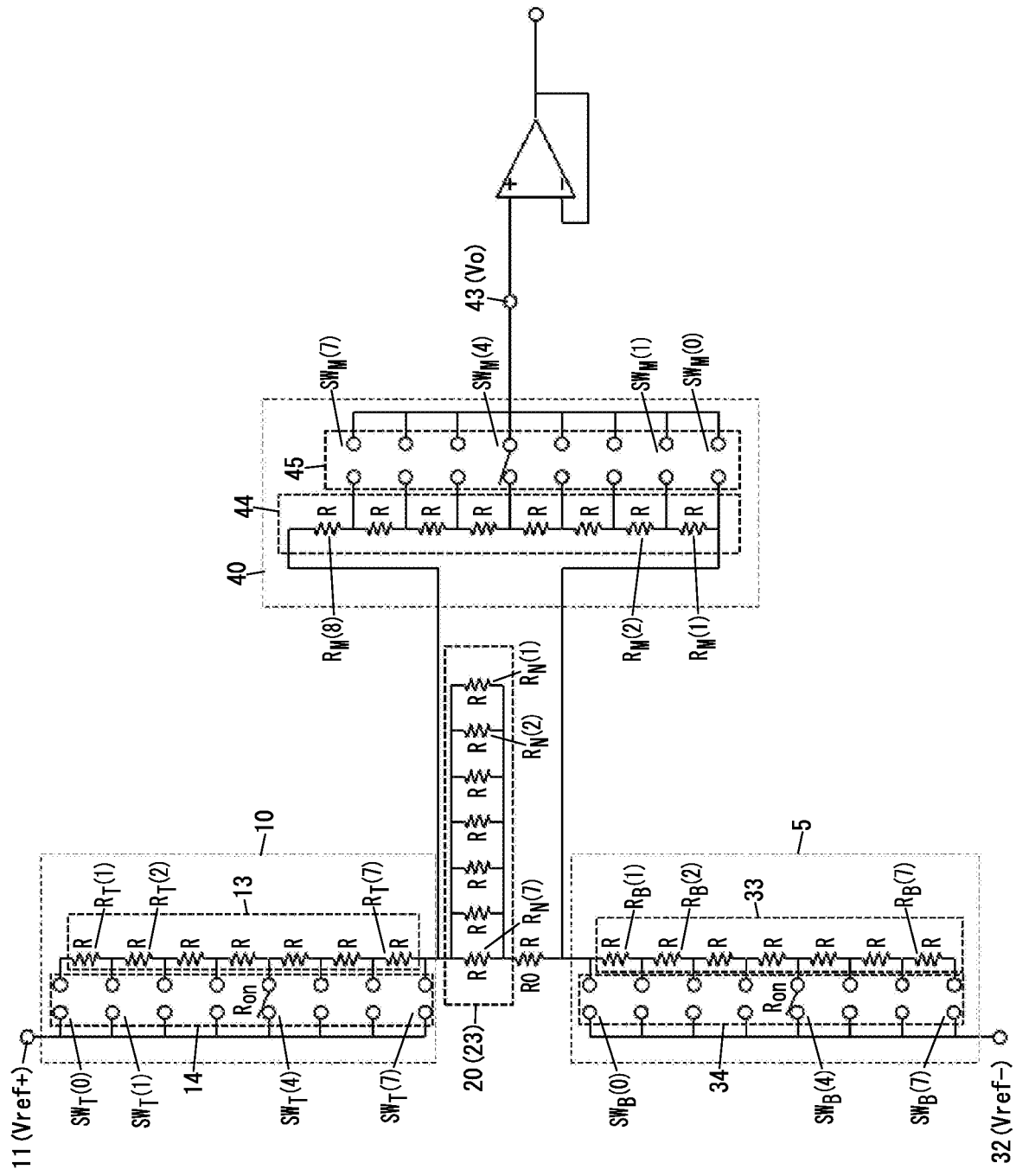
FIG. 6 is a circuit diagram of a digital-to-analog converter according to the first exemplary embodiment.

FIG. 6 is a circuit diagram illustrating an exemplary configuration for the digital-to-analog converter 100 according to the first embodiment. The circuit diagram shown in FIG. 6 illustrates a configuration for the digital-to-analog converter 100, to which a six-bit binary number [100100]$_2$ is also input as in the known converter. The high-side reference potential Vref+ applied to the first terminal 11 may be 5 V, for example. The low-side reference potential Vref− applied to the eighth terminal 32 may be GND (0 V), for example. Note that the digital-to-analog converter 100 changes the connections between (i.e., controls the ON/OFF states of) the switches included in the first group of switches 14, the third group of switches 34, and the fourth group of switches 45 in accordance with the digital signal input. Specifically, in the digital-to-analog converter 100 shown in FIG. 6, the switch $SW_M(4)$, the switch $SW_T(4)$, and the switch $SW_B(4)$ are turned ON in response to a digital signal [100100]$_2$. In the following description, the low-side reference potential Vref− is supposed to be 0 V.

In FIG. 6, the 6-bit digital value is designated by p and the ON-state resistance of all switches included in the first group of switches 14, the third group of switches 34, and the fourth group of switches 45 is designated by Ron. The output voltage Vo through the eleventh terminal 43 is given by the following Equation (11):

[Equation 11]

$$V_o = p \times \frac{Vref^+}{64} + \left(1 - \frac{2p}{64}\right) \times \frac{8R_{on}}{64R + 16R_{on}} \times \frac{Vref^+}{64} \quad (11)$$

Therefore, the integral nonlinearity error INL is calculated by the following Equation (12):

[Equation 12]

$$INL = \left(1 - \frac{2p}{64}\right) \times \frac{8R_{on}}{64R + 16R_{on}} \times \frac{Vref^+}{64} \quad (12)$$

Figure 7:
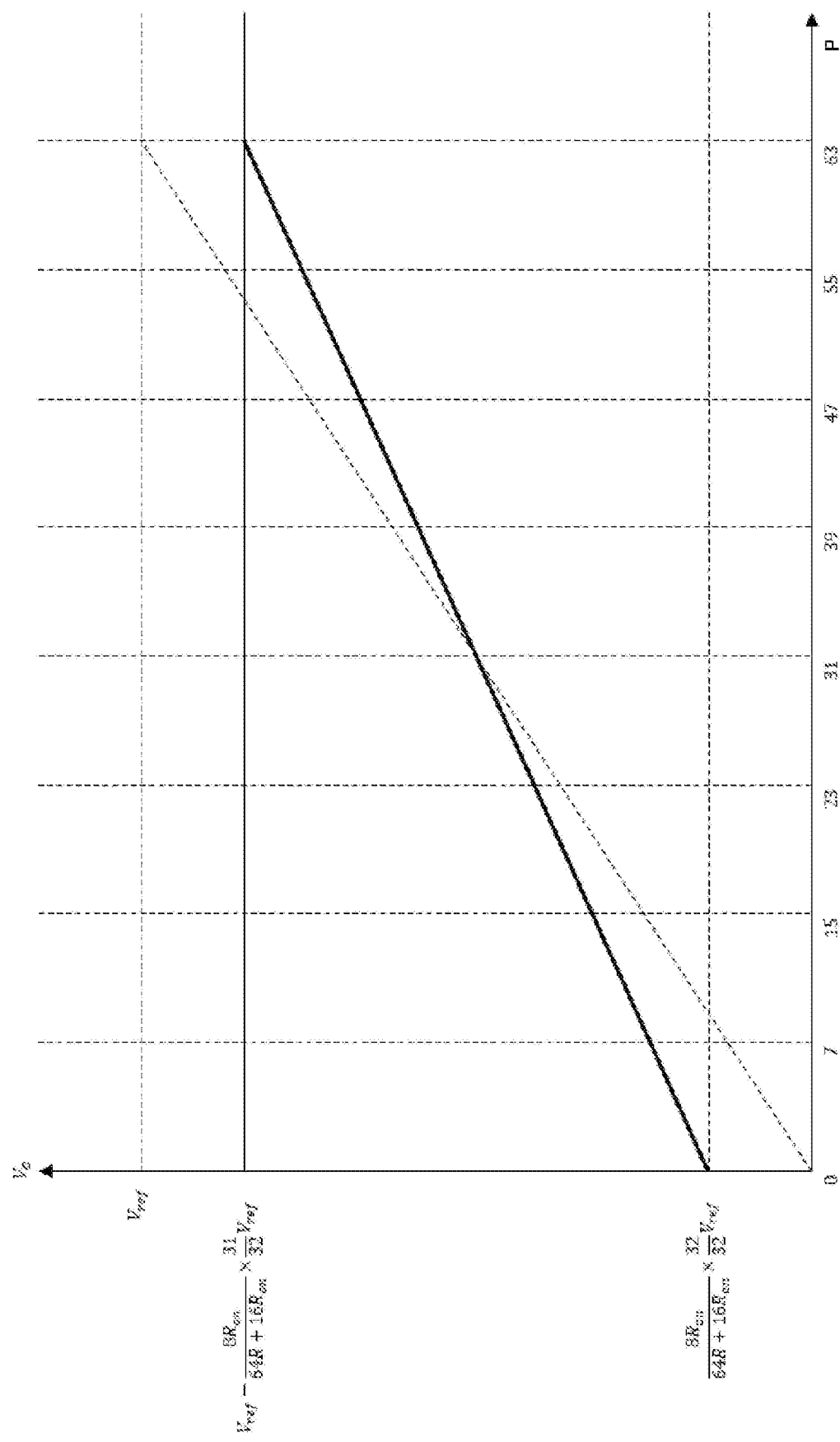
FIG. 7 is a graph showing a relationship when the ordinate of Equation (11) indicates an output voltage Vo and the abscissa thereof indicates a digital value p.
Figure 8:
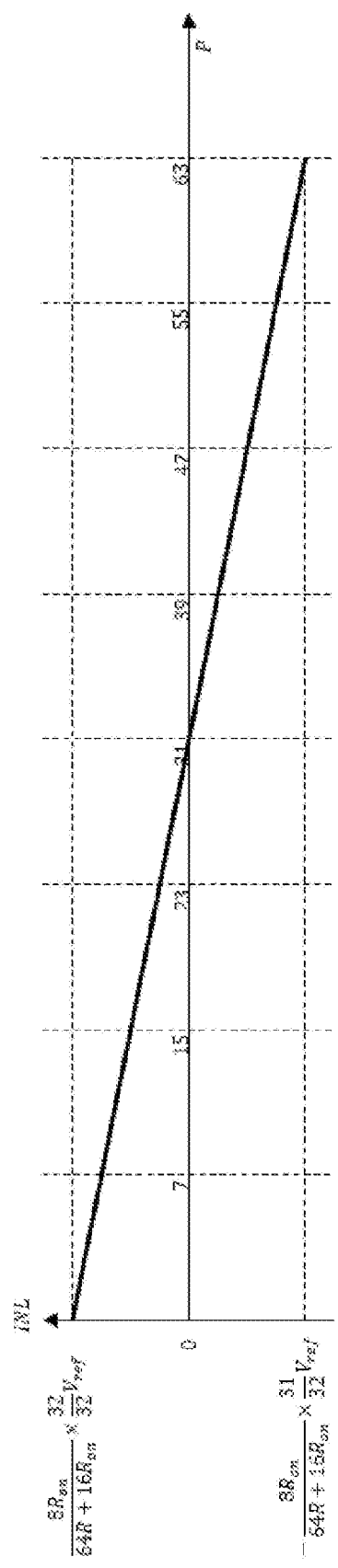
FIG. 8 is a graph showing a relationship when the ordinate of Equation (11) indicates an integral nonlinearity error INL and the abscissa thereof indicates a digital value p.

FIG. 7 is a graphic representation of Equation (11), in which the ordinate indicates the output voltage Vo and the abscissa indicates the digital value p. FIG. 8 is another graphic representation of Equation (11), in which the ordinate indicates the integral nonlinearity error INL and the abscissa indicates the digital value p.

Also, if the maximum error component of the integral nonlinearity error INL is designated by INLmax and the minimum error component thereof is designated by INLmin, then INLmax is given by the following Equation (13) and INLmin is given by the following Equation (14):

[Equation 13]

$$INL_{max} = \frac{8R_{on}}{64R + 16R_{on}} \times \frac{32}{32} Vref^+ \quad (13)$$

[Equation 14]

$$INL_{min} = \frac{8R_{on}}{64R + 16R_{on}} \times \frac{31}{32} Vref^+ \quad (14)$$

The output range of the output voltage Vo is regarded as an output characteristic restricted by the maximum and minimum error components of the integral nonlinearity error INL. In that case, the output voltage Vo is given by the following Equation (15), the output range of the output voltage Vo is given by the following Equation (16), and the integral nonlinearity error INL is as indicated by the following Equation (17):

[Equation 15]

$$V_o = p \times \frac{Vref^+}{64} \times \frac{8 - 8R_{on}}{64R + 16R_{on}} \quad (15)$$

[Equation 16]

$$\frac{8R_{on}}{64R + 16R_{on}} \times \frac{32}{32} Vref^+ \leq Vo \leq Vref^+ - \frac{8R_{on}}{64R + 16R_{on}} \times \frac{31}{32} Vref^+ \quad (16)$$

[Equation 17]

$$INL = 0 \quad (17)$$

Figure 9:
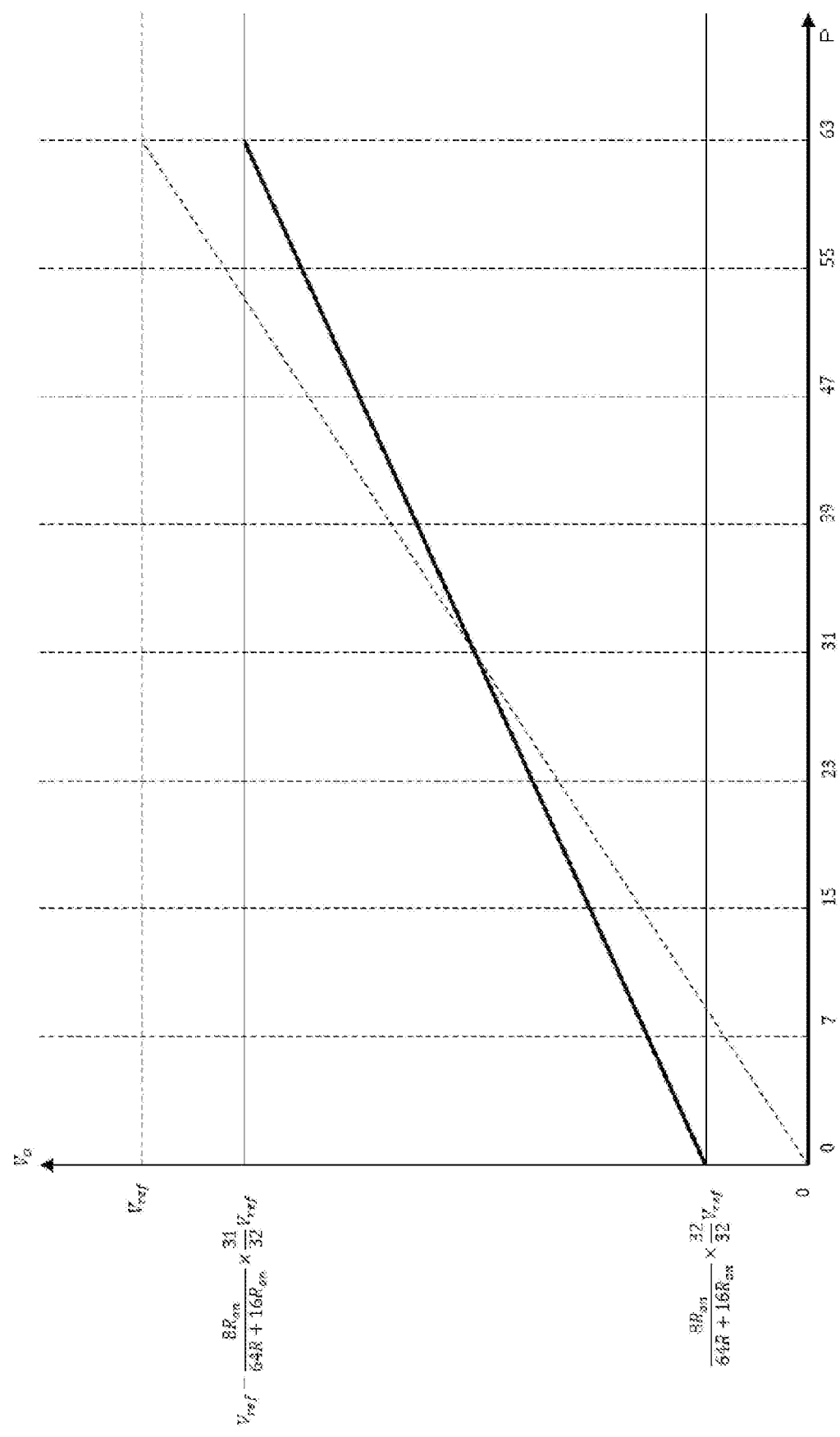
FIG. 9 is a graph showing a relationship when the ordinate of Equation (15) indicates an output voltage Vo and the abscissa thereof indicates a digital value p.
Figure 10:
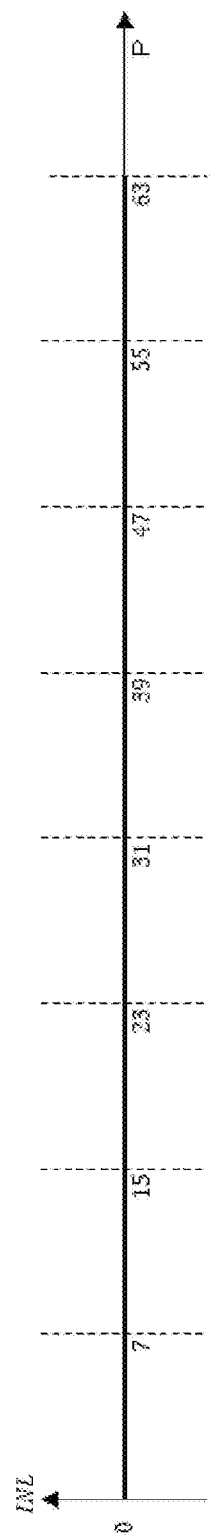
FIG. 10 is a graph showing a relationship when the ordinate of Equation (17) indicates an integral nonlinearity error INL and the abscissa thereof indicates a digital value p.

FIG. 9 is a graphic representation of Equation (15), in which the ordinate indicates the output voltage Vo and the abscissa indicates the digital value p. FIG. 10 is a graphic representation of Equation (17), in which the ordinate indicates the integral nonlinearity error INL and the abscissa indicates the digital value p.

Since the integral nonlinearity error INL goes zero as shown in FIG. 10, the digital-to-analog converter 100 has improved performance over the known converter. That is to say, the digital-to-analog converter 100 of the present disclosure is able to reduce the negative impact of the ON-state resistance of the switches, thus improving the DAC performance.

In addition, each of the switches $SW_T(0)$ to $SW_T(2^m-1)$ of the first group of switches 14 may be implemented as a p-channel transistor, and each of the switches $SW_B(0)$ to $SW_B(2^m-1)$ of the third group of switches 34 may be implemented as an n-channel transistor. This cuts down the number of transistors to a half, compared to a normal CMOS switch in which p-channel transistors and n-channel transistors are connected together in parallel. This reduces the number of parts and chip area required for the digital-to-analog converter 100, thus further cutting down the cost.

Second Embodiment

Next, a digital-to-analog converter 300 according to a second exemplary embodiment will be described.

Figure 11:
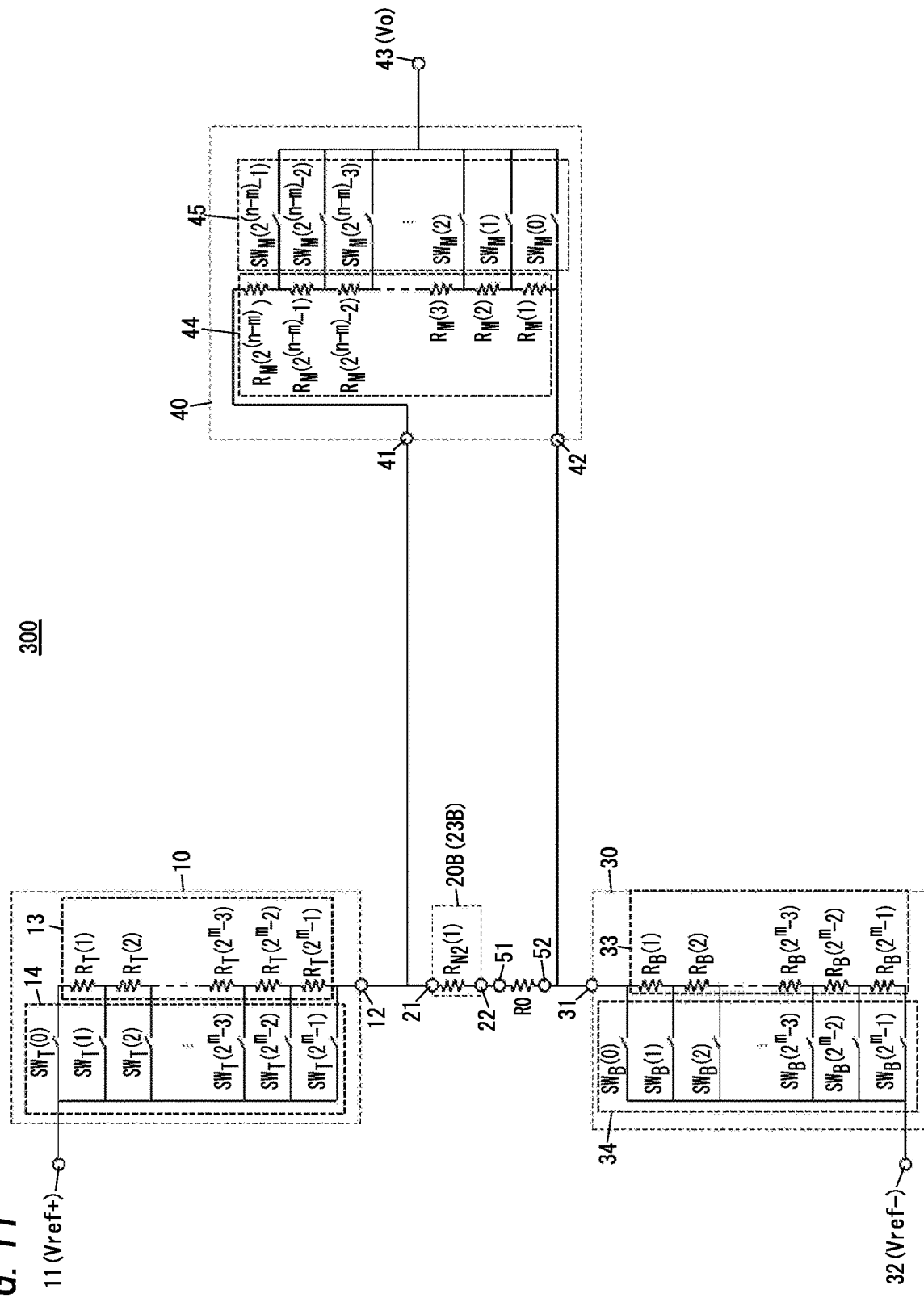
FIG. 11 is a circuit diagram of a digital-to-analog converter according to a second exemplary embodiment.

FIG. 11 is a circuit diagram of a digital-to-analog converter 300 according to the second exemplary embodiment. A major difference between the digital-to-analog converter 300 and the digital-to-analog converter 100 according to the first embodiment described above (see FIG. 1) lies in that the second partial circuit 20B is constituted of a single resistor $R_{N2}(1)$. In the following description, any constituent element of this digital-to-analog converter 300, having the same function as a counterpart of the digital-to-analog converter 100 described above, will be designated by the same reference numeral as that counterpart's.

The digital-to-analog converter 300 according to the second exemplary embodiment is an n-bit DAC, and the number of bits for use in fine adjustment is m. Thus, the number of bits for use in coarse adjustment is (n−m).

The digital-to-analog converter 300 includes a first partial circuit 10, the second partial circuit 20B, a third partial circuit 30, a fourth partial circuit 40, and a first resistor R0. The first partial circuit 10 has a first terminal 11 and a second terminal 12. The second partial circuit 20B has a third terminal 21 and a fourth terminal 22. The first resistor R0 has a fifth terminal 51 and a sixth terminal 52. The third partial circuit 30 has a seventh terminal 31 and an eighth terminal 32. The fourth partial circuit 40 has a ninth terminal 41, a tenth terminal 42, and an eleventh terminal 43. A high-side reference potential Vref+ is applied to the first terminal 11 of the first partial circuit 10. The second terminal 12 of the first partial circuit 10 is electrically connected to the third terminal 21 of the second partial circuit 20B and the ninth terminal 41 of the fourth partial circuit 40. The fourth terminal 22 of the second partial circuit 20B is connected to the fifth terminal 51 of the first resistor R0. The sixth terminal 52 of the first resistor R0 is electrically connected to the seventh terminal 31 of the third partial circuit 30 and the tenth terminal 42 of the fourth partial circuit 40. A low-side reference potential Vref− is applied to the eighth terminal 32 of the third partial circuit 30. An output voltage Vo specified by a digital signal is delivered as an analog signal through the eleventh terminal 43 of the fourth partial circuit 40.

The second partial circuit 20B includes a second bank of resistors 23, which is constituted of a single resistor $R_{N2}(1)$ electrically connected between the third terminal 21 and the fourth terminal 22. The resistance value of the second bank of resistors 23B, i.e., the resistance value of the resistor $R_{N2}(1)$, is $1/(2^{(n-m)}-1)$ of the resistance value of the first resistor R0.

The fourth partial circuit 40 includes a fourth bank of resistors 44 and a fourth group of switches 45. The fourth bank of resistors 44 is constituted of $2^{(n-m)}$ resistors $R_M(1)$ to $R_M(2^{(n-m)})$ that are connected together in series between the ninth terminal 41 and the tenth terminal 42. The fourth group of switches 45 includes $2^{(n-m)}$ switches $SW_M(0)$ to $SW_M(2^{(n-m)}-1)$ configured to electrically connect respective nodes of the fourth bank of resistors 44 to the eleventh terminal 43 in response to a digital signal. Specifically, the $2^{(n-m)}$ switches $SW_M(0)$ to $SW_M(2^{(n-m)}-1)$ are electrically connected between all of the $2^{(n-m)}$ nodes of the $2^{(n-m)}$ resistors $R_M(1)$ to $R_M(2^{(n-m)})$, but the node located closest to the ninth terminal 41 (including the point of connection of the fourth bank of resistors 44 to the tenth terminal 42) and the eleventh terminal 43. The $2^{(n-m)}$ switches $SW_M(0)$ to $SW_M(2^{(n-m)}-1)$ turn ON and OFF in response to the digital signal. The combined resistance value of the fourth bank of resistors 44 is $2^{(m-n)}$ times the resistance value of the first resistor R0.

The first partial circuit 10 includes a first bank of resistors 13 and a first group of switches 14. The first bank of resistors 13 is constituted of $2^m-1$ resistors $R_T(1)$ to $R_T(2^m-1)$ that are connected together in series between the first terminal 11 and the second terminal 12. The first group of switches 14 includes $2^m$ switches $SW_T(0)$ to $SW_T(2^m-1)$ configured to electrically connect the nodes of the first bank of resistors 13 to the first terminal 11 in response to the digital signal. Specifically, the $2^m$ switches $SW_T(0)$ to $SW_T(2^m-1)$ are electrically connected between the $2^m$ nodes of the $2^m-1$ resistors $R_T(1)$ to $R_T(2^m-1)$ (including the two terminals of the first bank of resistors 13) and the first terminal 11. The $2^m$ switches $SW_T(0)$ to $SW_T(2^m-1)$ turn ON and OFF in response to the digital signal. The combined resistance value of the first bank of resistors 13 is $2^m-1$ times the resistance value of the first resistor R0.

The third partial circuit 30 includes a third bank of resistors 33 and a third group of switches 34. The third bank of resistors 33 is constituted of $2^m-1$ resistors $R_B(1)$ to $R_B(2^m-1)$ that are connected together in series between the seventh terminal 31 and the eighth terminal 32. The third group of switches 34 includes $2^m$ switches $SW_B(0)$ to $SW_B(2^m-1)$ configured to electrically connect the nodes of the third bank of resistors 33 to the eighth terminal 32 in response to the digital signal. Specifically, the $2^m$ switches $SW_B(0)$ to $SW_B(2^m-1)$ are electrically connected between the $2^m$ nodes of the $2^m-1$ resistors $R_B(1)$ to $R_B(2^m-1)$ (including the two terminals of the third bank of resistors 33) and the eighth terminal 32. The $2^m$ switches $SW_B(0)$ to $SW_B(2^m-1)$ turn ON and OFF in response to the digital signal. The combined resistance value of the third bank of resistors 33 is $2^m-1$ times the resistance value of the first resistor R0.

Figure 12:
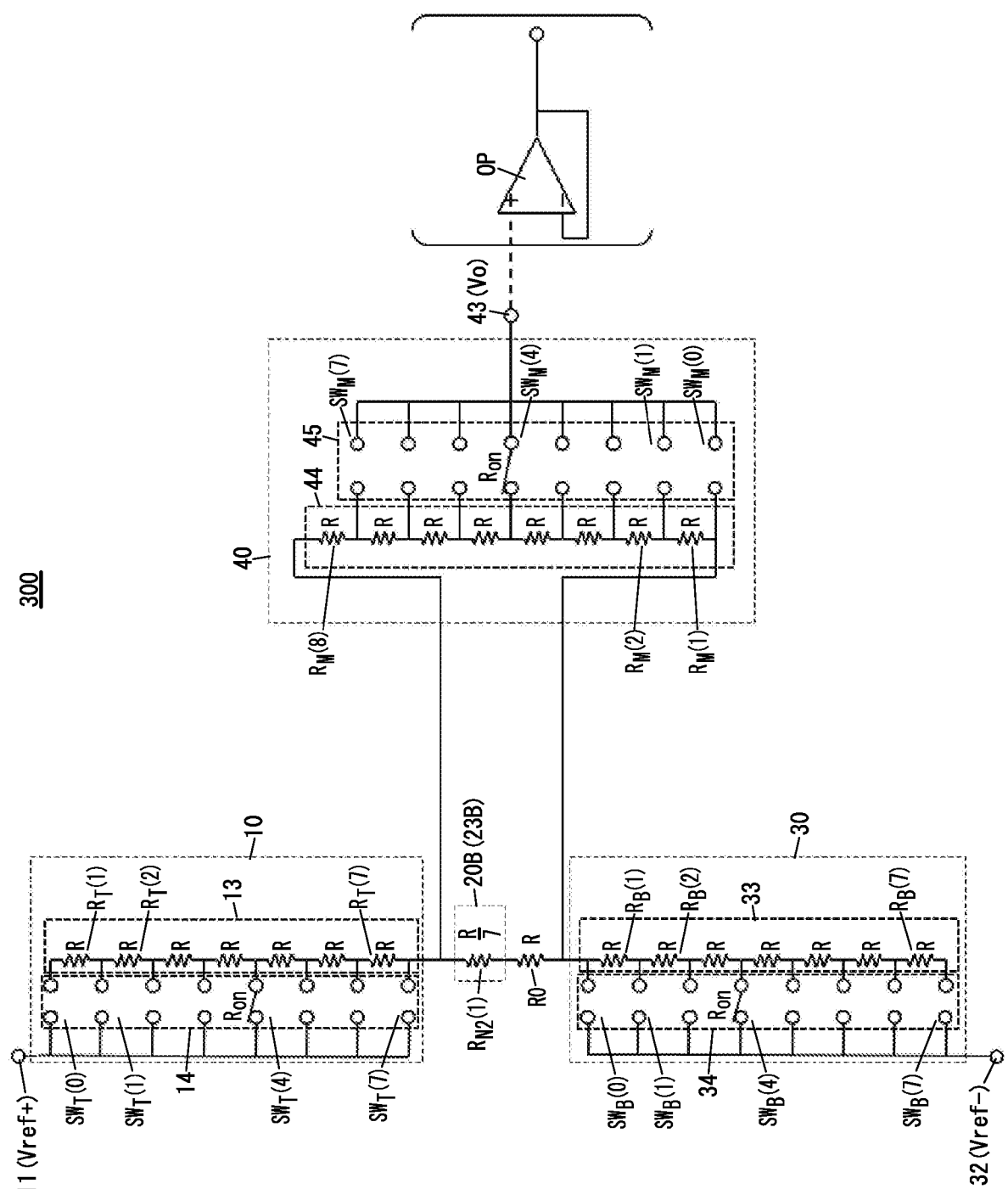
FIG. 12 is a circuit diagram of the digital-to-analog converter implemented as a six-bit type.

FIG. 12 is a circuit diagram illustrating an exemplary configuration for the digital-to-analog converter 300. The circuit diagram shown in FIG. 12 illustrates a configuration for the digital-to-analog converter 300, to which a six-bit binary number $[100100]_2$ is also input as in the known converter. As in the digital-to-analog converter 100 according to the first embodiment, the digital-to-analog converter 300 shown in FIG. 12 has the output voltage Vo through the eleventh terminal 43 thereof given by Equation (11) and has the integral nonlinearity error INL thereof given by Equation (12). Also, if the maximum error component of the integral nonlinearity error INL is designated by INLmax and the minimum error component thereof is designated by INLmin, then INLmax is given by Equation (13) and INLmin is given by Equation (14). Furthermore, the output range of the output voltage Vo is regarded as an output characteristic restricted by the maximum and minimum error components of the integral nonlinearity error INL. In that case, the output voltage Vo is given by Equation (15), the output range of the output voltage Vo is given by Equation (16), and the integral nonlinearity error INL is as indicated by Equation (17). Thus, the digital-to-analog converter 300 is able to have improved DAC performance over the known converter.

In the digital-to-analog converter 100 according to the first embodiment (see FIG. 1), the second bank of resistors 23 of the second partial circuit 20 is constituted of $2^{(n-m)}-1$ resistors $R_N(1)$ to $R_N(2^{(n-m)}-1)$ that are connected together in parallel. On the other hand, in the digital-to-analog converter 300 according to the second embodiment, the second bank of resistors 23B of the second partial circuit 20B is constituted of a single resistor $R_{N2}(1)$, of which the resistance value is $1/(2^{(n-m)}-1)$ of that of the first resistor R0. This reduces the number of parts and chip area for installation, thus enabling the digital-to-analog converter 300 to be manufactured at a lower cost than the digital-to-analog converter 100 according to the first embodiment.

In addition, each of the switches $SW_T(0)$ to $SW_T(2^m-1)$ of the first group of switches 14 may be implemented as a p-channel transistor, and each of the switches $SW_B(0)$ to $SW_B(2^m-1)$ of the third group of switches 34 may be implemented as an n-channel transistor. This cuts down the number of transistors to a half, compared to a normal CMOS switch in which p-channel transistors and n-channel transistors are connected together in parallel. This reduces the number of parts and chip area required for the digital-to-analog converter 300, thus further cutting down the cost.

Third Embodiment

Next, a digital-to-analog converter 400 according to a third exemplary embodiment will be described.

Figure 13:
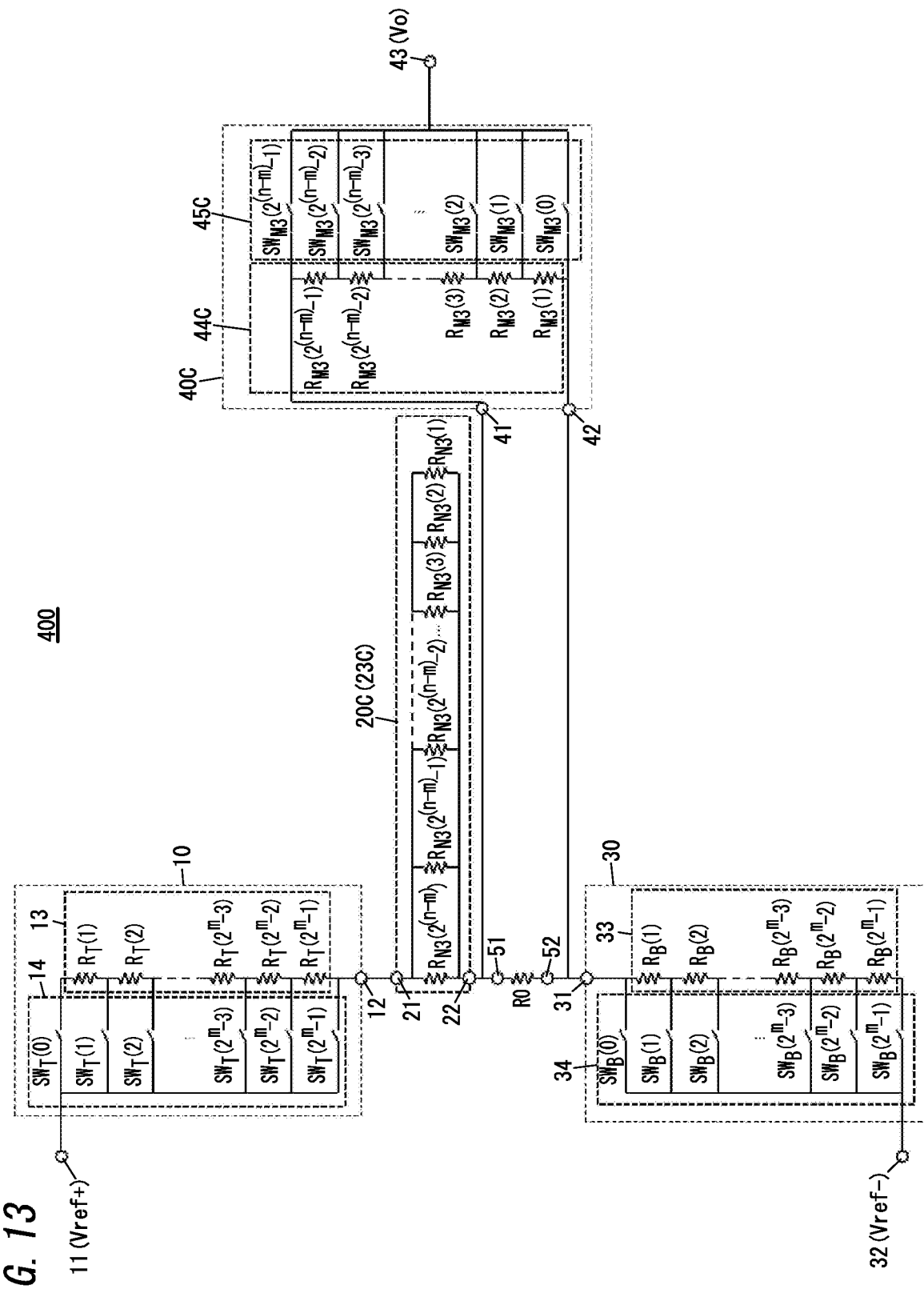
FIG. 13 is a circuit diagram of a digital-to-analog converter according to a third exemplary embodiment.

FIG. 13 is a circuit diagram of a digital-to-analog converter 400 according to the third exemplary embodiment. A major difference between the digital-to-analog converter 400 and the digital-to-analog converter 100 according to the first embodiment described above (see FIG. 1) lies in that the fourth partial circuit 40C is connected in parallel with only the first resistor R0. In the following description, any constituent element of this digital-to-analog converter 400, having the same function as a counterpart of the digital-to-analog converter 100 described above, will be designated by the same reference numeral as that counterpart's.

The digital-to-analog converter 400 according to the third exemplary embodiment is an n-bit DAC, and the number of bits for use in fine adjustment is m. Thus, the number of bits for use in coarse adjustment is (n–m).

The digital-to-analog converter 400 includes a first partial circuit 10, a second partial circuit 20C, a third partial circuit 30, the fourth partial circuit 40C, and the first resistor R0 (reference resistor). The first partial circuit 10 has a first terminal 11 and a second terminal 12. The second partial circuit 20C has a third terminal 21 and a fourth terminal 22. The first resistor R0 has a fifth terminal 51 and a sixth terminal 52. The third partial circuit 30C has a seventh terminal 31 and an eighth terminal 32. The fourth partial circuit 40C has a ninth terminal 41, a tenth terminal 42, and an eleventh terminal 43. A high-side reference potential Vref+ is applied to the first terminal 11 of the first partial circuit 10. The second terminal 12 of the first partial circuit 10 is connected to the third terminal 21 of the second partial circuit 20C. The fourth terminal 22 of the second partial circuit 20C is electrically connected to the fifth terminal 51 of the first resistor R0 and the ninth terminal 41 of the fourth partial circuit 40C. The sixth terminal 52 of the first resistor R0 is electrically connected to the seventh terminal 31 of the third partial circuit 30 and the tenth terminal 42 of the fourth partial circuit 40C. A low-side reference potential Vref− is applied to the eighth terminal 32 of the third partial circuit 30. An output voltage Vo specified by a digital signal is output as an analog signal through the eleventh terminal 43 of the fourth partial circuit 40C.

The second partial circuit 20C includes a second bank of resistors 23C, which is constituted of $2^{(n-m)}$ resistors $R_{N3}(1)$ to $R_{N3}(2^{(n-m)})$ that are connected together in parallel between the third terminal 21 and the fourth terminal 22. The combined resistance value of the second bank of resistors 23 is $1/(2^{(n-m)})$ of the resistance value of the first resistor R0.

The fourth partial circuit 40C includes a fourth bank of resistors 44C and a fourth group of switches 45C. The fourth bank of resistors 44C is constituted of resistors $R_{M3}(1)$ to $R_{M3}(2^{(n-m)}-1)$ that are connected together in series between the ninth terminal 41 and the tenth terminal 42. The fourth group of switches 45C includes $2^{(n-m)}$ switches $SW_{M3}(0)$ to $SW_{M3}(2^{(n-m)}-1)$ configured to electrically connect respective nodes of the fourth bank of resistors 44C to the eleventh terminal 43 in response to a digital signal. Specifically, the $2^{(n-m)}$ switches $SW_{M3}(0)$ to $SW_{M3}(2^{(n-m)}-1)$ are electrically connected between the $2^{(n-m)}$ nodes of the $2^{(n-m)}-1$ resistors $R_{M3}(1)$ to $R_{M3}(2^{(n-m)}-1)$ (including the two terminals of the fourth bank of resistors 44C) and the eleventh terminal 43. The $2^{(n-m)}$ switches $SW_{M3}(0)$ to $SW_{M3}(2^{(n-m)}-1)$ turn ON and OFF in response to the digital signal. The combined resistance value of the fourth bank of resistors 44C is $2^{(m-n)}-1$ times the resistance value of the first resistor R0.

The first partial circuit 10 includes a first bank of resistors 13 and a first group of switches 14. The first bank of resistors 13 is constituted of $2^m-1$ resistors $R_T(1)$ to $R_T(2^m-1)$ that are connected together in series between the first terminal 11 and the second terminal 12. The first group of switches 14 includes $2^m$ switches $SW_T(0)$ to $SW_T(2^m-1)$ configured to electrically connect the nodes of the first bank of resistors 13 to the first terminal 11 in response to the digital signal. Specifically, the $2^m$ switches $SW_T(0)$ to $SW_T(2^m-1)$ are electrically connected between the $2^m$ nodes of the $2^m-1$ resistors $R_T(1)$ to $R_T(2^m-1)$ (including the two terminals of the first bank of resistors 13) and the first terminal 11. The $2^m$ switches $SW_T(0)$ to $SW_T(2^m-1)$ turn ON and OFF in response to the digital signal. The combined resistance value of the first bank of resistors 13 is $2^m-1$ times the resistance value of the first resistor R0.

The third partial circuit 30 includes a third bank of resistors 33 and a third group of switches 34. The third bank of resistors 33 is constituted of $2^m-1$ resistors $R_B(1)$ to $R_B(2^m-1)$ that are connected together in series between the seventh terminal 31 and the eighth terminal 32. The third group of switches 34 includes $2^m$ switches $SW_B(0)$ to $SW_B(2^m-1)$ configured to electrically connect the nodes of the third bank of resistors 33 to the eighth terminal 32 in response to the digital signal. Specifically, the $2^m$ switches $SW_B(0)$ to $SW_B(2^m-1)$ are electrically connected between the $2^m$ nodes of the $2^m-1$ resistors $R_B(1)$ to $R_B(2^m-1)$ (including the two terminals of the third bank of resistors 33) and the eighth terminal 32. The $2^m$ switches $SW_B(0)$ to $SW_B(2^m-1)$ turn ON and OFF in response to the digital signal. The combined resistance value of the third bank of resistors 33 is $2^m-1$ times the resistance value of the first resistor R0.

First, the combined resistance Rz of the second partial circuit 20C, the fourth partial circuit 40C, and the first resistor R0 is given by the following Equation (18):

[Equation 18]

$$R_z = \frac{1}{\sum_{i=1}^{2^{(n-m)}} \frac{1}{R_{N3(i)}}} + \frac{1}{\frac{1}{\sum_{i=1}^{2^{(n-m)}-1} R_{M3(i)}} + \frac{1}{R0}} \quad (18)$$

In this case, suppose the resistors $R_{N3}(1)$ to $R_{N3}(2^{(n-m)})$ that form the second partial circuit 20C, the first resistor R0, and the resistors $R_{M3}(1)$ to $R_{M3}(2^{(n-m)}-1)$ that form the fourth partial circuit 40C all have the same resistance value R as in Equation (8) of the first embodiment for the sake of simplicity.

Equation (18) may be modified, using an equation similar to Equation (8), into the following Equation (19):

[Equation 19]

$$R_z = \frac{R}{2^{(n\,m)}} + \frac{1}{\frac{1}{(2^{(n-m)}-1)R} + \frac{1}{R}} = \quad (19)$$

$$\frac{R}{2^{(n\,m)}} + \frac{(2^{(n-m)}-1)R}{2^{(n\,m)}} = \frac{2^{(n-m)} \times R}{2^{(n\,m)}} = R$$

Likewise, suppose the resistors $R_T(1)$ to $R_T(2^m-1)$ that form the first partial circuit 10 and the resistors $R_B(1)$ to $R_B(2^m-1)$ that form the third partial circuit 30 all have the same resistance value R as represented by Equation (10).

When Equation (10) is applied to the digital-to-analog converter 400, the combined resistance Rz of the second bank of resistors 23C, the fourth bank of resistors 44C, and the first resistor R0 has the same resistance value as each of the resistors $R_T(1)$ to $R_T(2^m-1)$ that form the first bank of resistors 13 and each of the resistors $R_B(1)$ to $R_B(2^m-1)$ that form the third bank of resistors 33. Thus, the reference potential Vref+ is divided at regular intervals, not only when the coarse adjustment is made but also when the fine adjustment is made (provided that the low-side reference potential Vref− is 0 V).

Thus, as in the first embodiment, the output voltage Vo is given by Equation (11) and the integral nonlinearity error INL is given by Equation (12). Also, if the maximum error component of the integral nonlinearity error INL is designated by INLmax and the minimum error component thereof is designated by INLmin, then INLmax is given by Equation (13) and INLmin is given by Equation (14).

Furthermore, the output range of the output voltage Vo is regarded as an output characteristic restricted by the maximum and minimum error components of the integral nonlinearity error INL. In that case, the output voltage Vo is given by Equation (15), the output range of the output voltage Vo is given by Equation (16), and the integral nonlinearity error INL is as indicated by Equation (17). Since the integral nonlinearity error INL goes zero, the digital-to-analog converter 400 is able to have improved performance over the known converter. That is to say, the digital-to-analog converter 400 of the present disclosure is able to reduce the negative impact of the ON-state resistance of the switches, thus improving the DAC performance.

In addition, each of the switches $SW_T(0)$ to $SW_T(2^m-1)$ of the first group of switches 14 may be implemented as a p-channel transistor, and each of the switches $SW_B(0)$ to $SW_B(2^m-1)$ of the third group of switches 34 may be implemented as an n-channel transistor. This cuts down the number of transistors to a half, compared to a normal CMOS switch in which p-channel transistors and n-channel transistors are connected together in parallel. This reduces the number of parts and chip area required for the digital-to-analog converter 400, thus further cutting down the cost.

Fourth Embodiment

Next, a digital-to-analog converter 500 according to a fourth exemplary embodiment will be described.

Figure 14:
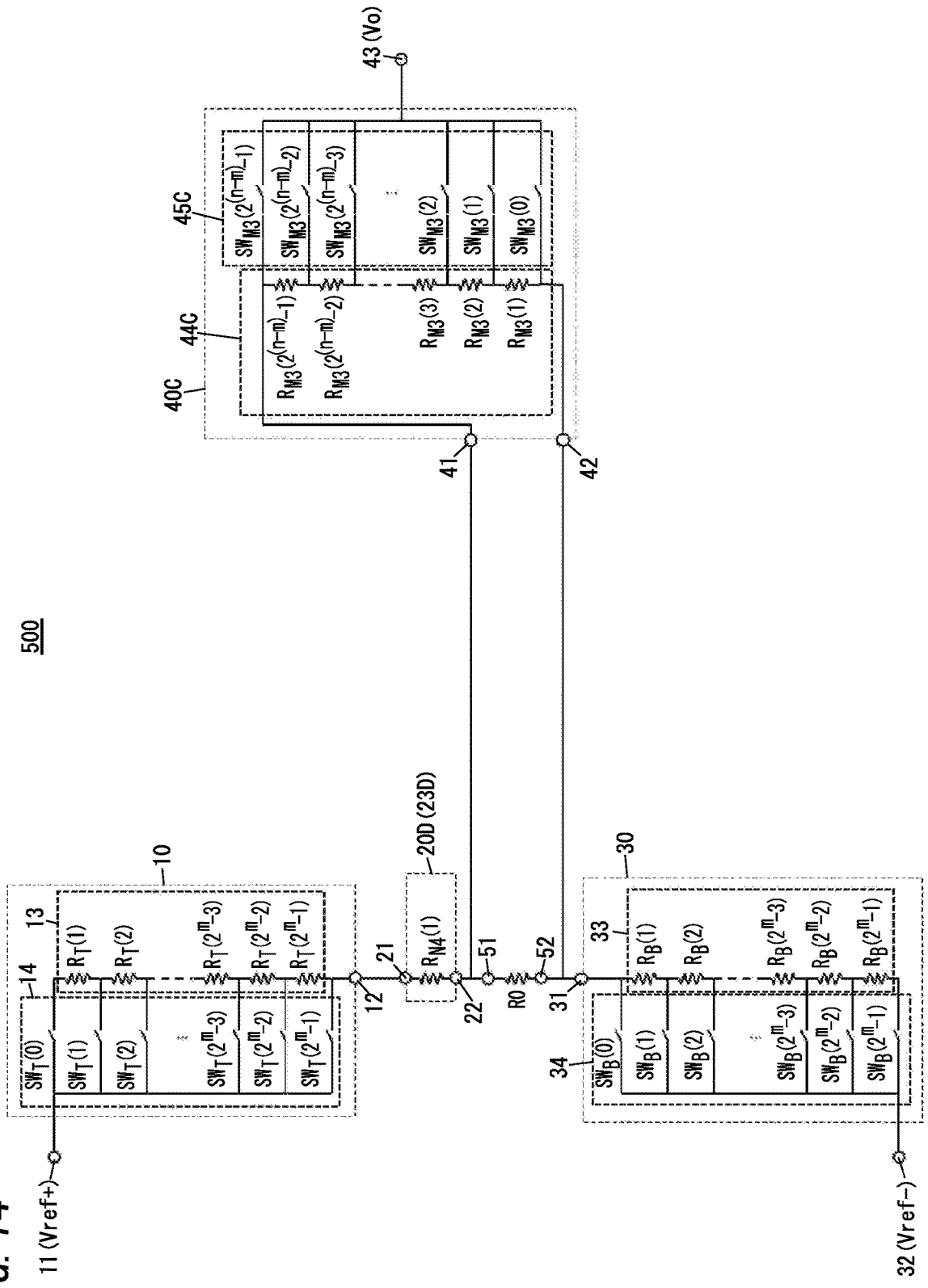
FIG. 14 is a circuit diagram of a digital-to-analog converter according to a fourth exemplary embodiment.

FIG. 14 is a circuit diagram of a digital-to-analog converter 500 according to the fourth exemplary embodiment. A major difference between the digital-to-analog converter 500 and the digital-to-analog converter 400 according to the third embodiment described above lies in that the second partial circuit 20D is constituted of a single resistor $R_{N4}(1)$. In the following description, any constituent element of this digital-to-analog converter 500, having the same function as a counterpart of the digital-to-analog converter 400 described above, will be designated by the same reference numeral as that counterpart's.

The digital-to-analog converter 500 according to the fourth exemplary embodiment is an n-bit DAC, and the number of bits for use in fine adjustment is m. Thus, the number of bits for use in coarse adjustment is (n−m).

The digital-to-analog converter 500 includes a first partial circuit 10, the second partial circuit 20D, a third partial circuit 30, a fourth partial circuit 40C, and a first resistor R0. The first partial circuit 10 has a first terminal 11 and a second terminal 12. The second partial circuit 20D has a third terminal 21 and a fourth terminal 22. The first resistor R0 has a fifth terminal 51 and a sixth terminal 52. The third partial circuit 30 has a seventh terminal 31 and an eighth terminal 32. The fourth partial circuit 40C has a ninth terminal 41, a tenth terminal 42, and an eleventh terminal 43. A high-side reference potential Vref+ is applied to the first terminal 11 of the first partial circuit 10. The second terminal 12 of the first partial circuit 10 is connected to the third terminal 21 of the second partial circuit 20D. The fourth terminal 22 of the second partial circuit 20D is electrically connected to the fifth terminal 51 of the first resistor R0 and the ninth terminal 41 of the fourth partial circuit 40C. The sixth terminal 52 of the first resistor R0 is electrically connected to the seventh terminal 31 of the third partial circuit 30 and the tenth terminal 42 of the fourth partial circuit 40C. A low-side reference potential Vref− is applied to the eighth terminal 32 of the third partial circuit 30. An output voltage Vo specified by a digital signal is output as an analog signal through the eleventh terminal 43 of the fourth partial circuit 40C.

The second partial circuit 20D includes a second bank of resistors 23D, which is constituted of a single resistor $R_{N4}(1)$ electrically connected between the third terminal 21 and the fourth terminal 22. The resistance value of the second bank of resistors 23D, i.e., the resistance value of the resistor $R_{N4}(1)$, is $1/(2^{(n-m)})$ of the resistance value of the first resistor R0.

The fourth partial circuit 40C includes a fourth bank of resistors 44C and a fourth group of switches 45C. The fourth bank of resistors 44C is constituted of $2^{(n-m)}-1$ resistors $R_{M3}(1)$ to $R_{M3}(2^{(n-m)}-1)$ that are connected together in series between the ninth terminal 41 and the tenth terminal 42. The fourth group of switches 45C includes $2^{(n-m)}$ switches $SW_{M3}$ (0) to $SW_{M3}(2^{(n-m)}-1)$ configured to electrically connect respective nodes of the fourth bank of resistors 44C to the eleventh terminal 43 in response to the digital signal. Specifically, the $2^{(n-m)}$ switches $SW_{M3}(0)$ to $SW_{M3}(2^{(n-m)}-1)$ are electrically connected between the $2^{(n-m)}$ nodes of the $2^{(n-m)}-1$ resistors $R_{M3}(1)$ to $R_{M3}(2^{(n-m)}-1)$ (including the two terminals of the fourth bank of resistors 44C) and the eleventh terminal 43. The $2^{(n-m)}$ switches $SW_{M3}(0)$ to $SW_{M3}(2^{(n-m)}-1)$ turn ON and OFF in response to the digital signal. The combined resistance value of the fourth bank of resistors 44C is $2^{(m-n)}-1$ times the resistance value of the first resistor R0.

The first partial circuit 10 includes a first bank of resistors 13 and a first group of switches 14. The first bank of resistors 13 is constituted of $2^m-1$ resistors $R_T(1)$ to $R_T(2^m-1)$ that are connected together in series between the first terminal 11 and the second terminal 12. The first group of switches 14 includes $2^m$ switches $SW_T(0)$ to $SW_T(2^m-1)$ configured to electrically connect the nodes of the first bank of resistors 13 to the first terminal 11 in response to the digital signal. Specifically, the $2^m$ switches $SW_T(0)$ to $SW_T(2^m-1)$ are electrically connected between the $2^m$ nodes of the $2^m-1$ resistors $R_T(1)$ to $R_T(2^m-1)$ (including the two terminals of the first bank of resistors 13) and the first terminal 11. The $2^m$ switches $SW_T(0)$ to $SW_T(2^m-1)$ turn ON and OFF in response to a digital signal. The combined resistance value of the first bank of resistors 13 is $2^m-1$ times the resistance value of the first resistor R0.

The third partial circuit 30 includes a third bank of resistors 33 and a third group of switches 34. The third bank of resistors 33 is constituted of $2^m-1$ resistors $R_B(1)$ to $R_B(2^m-1)$ that are connected together in series between the seventh terminal 31 and the eighth terminal 32. The third group of switches 34 includes $2^m$ switches $SW_B(0)$ to $SW_B(2^m-1)$ configured to electrically connect the nodes of the third bank of resistors 33 to the eighth terminal 32 in response to the digital signal. Specifically, the $2^m$ switches $SW_B(0)$ to $SW_B(2^m-1)$ are electrically connected between the $2^m$ nodes of the $2^m-1$ resistors $R_B(1)$ to $R_B(2^m-1)$ (including the two terminals of the third bank of resistors 33) and the eighth terminal 32. The $2^m$ switches $SW_B(0)$ to $SW_B(2^m-1)$ turn ON and OFF in response to the digital signal. The combined resistance value of the third bank of resistors 33 is $2^m-1$ times the resistance value of the first resistor R0.

Figure 15:
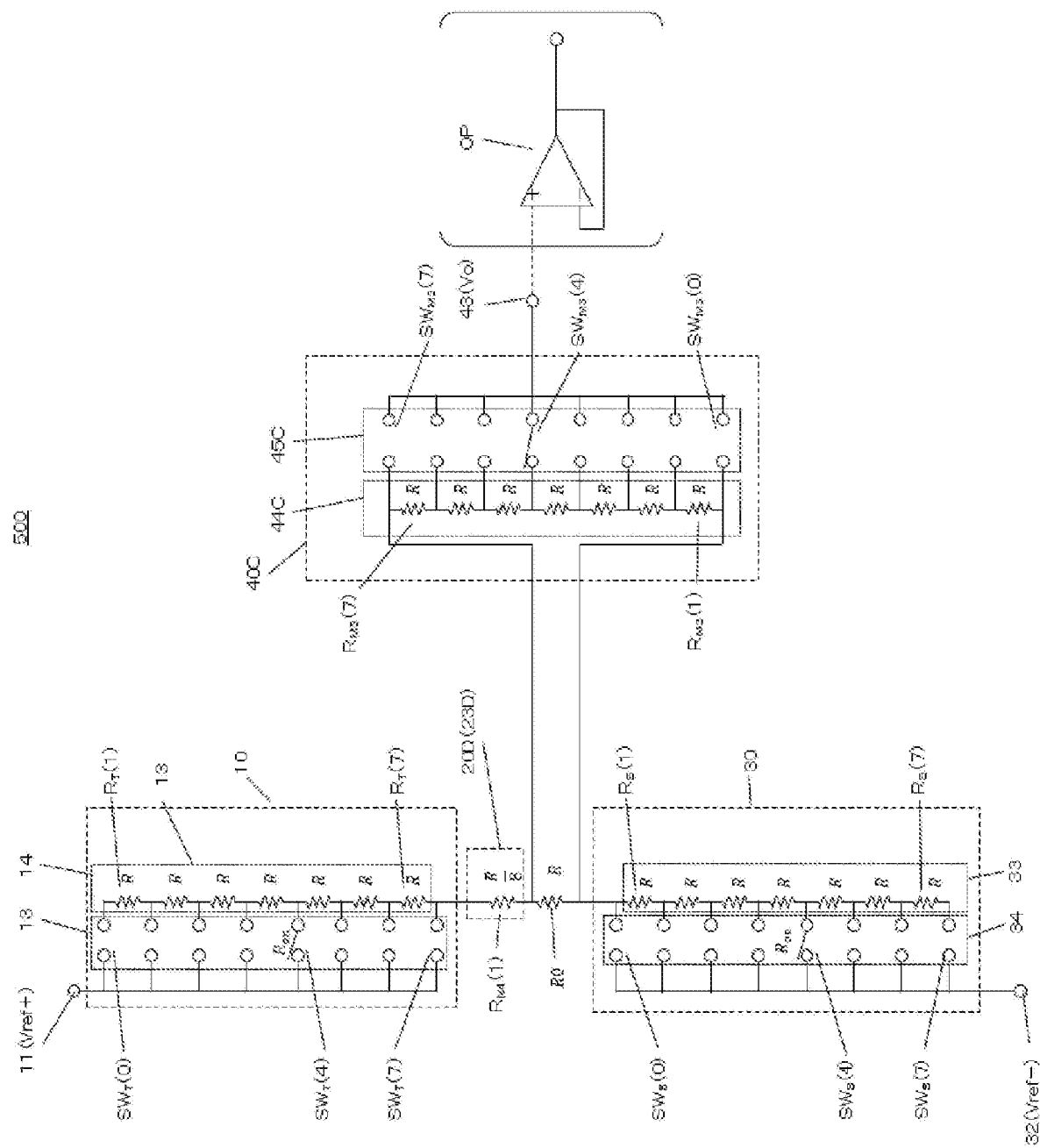
FIG. 15 is a circuit diagram of the digital-to-analog converter implemented as a six-bit type.

FIG. 15 is a circuit diagram illustrating an exemplary configuration for the digital-to-analog converter 500. Specifically, the circuit diagram illustrated in FIG. 15 illustrates a configuration for the digital-to-analog converter 500, to which $[100100]_2$ is input as a six-bit binary number as in the known digital-to-analog converter. In the digital-to-analog converter 500 shown in FIG. 15, the output voltage Vo from the eleventh terminal 43 is represented by Equation (11) and the integral nonlinearity error INL is represented by Equation (12) as in the digital-to-analog converter 400 according to the third embodiment described above. Thus, supposing the maximum error component of the integral nonlinearity error INL is indicated by INLmax and the minimum error component thereof is indicated by INLmin, INLmax is represented by Equation (13) and INLmin is represented by Equation (14). Furthermore, the output range of the output voltage Vo is regarded as an output characteristic narrowed by the maximum error component and minimum error component of the integral nonlinearity error INL. In that case, the output voltage Vo is represented by Equation (15), the output range of the output voltage Vo is defined by Equation (16), and the integral nonlinearity error INL is represented by Equation (17). This allows the digital-to-analog converter 500 to have its performance improved, compared to known digital-to-analog converters.

In the digital-to-analog converter 400 according to the third embodiment (see FIG. 13), the second bank of resistors 23C of the second partial circuit 20C is constituted of resistors $R_{N3}(1)$ to $R_{N3}(2^{(n-m)})$ that are connected together in parallel. On the other hand, in the digital-to-analog converter 500 according to the fourth embodiment, the second bank of resistors 23D of the second partial circuit 20D is constituted of a single resistor $R_{N4}(1)$, of which the resistance value is $\frac{1}{2}^{(n-m)}$ of that of the first resistor R0. This reduces the number of parts and chip area for installation, thus enabling the digital-to-analog converter 500 to be manufactured at a lower cost than the digital-to-analog converter 400 according to the third embodiment.

In addition, each of the switches $SW_T(0)$ to $SW_T(2^m-1)$ of the first group of switches 14 may be implemented as a p-channel transistor, and each of the switches $SW_B(0)$ to $SW_B(2^m-1)$ of the third group of switches 34 may be implemented as an n-channel transistor. This cuts down the number of transistors to a half, compared to a normal CMOS switch in which p-channel transistors and n-channel transistors are connected together in parallel. This reduces the number of parts and chip area required for the digital-to-analog converter 500, thus further cutting down the cost.

Fifth Embodiment

Next, a digital-to-analog converter 600 according to a fifth exemplary embodiment will be described.

Figure 16:
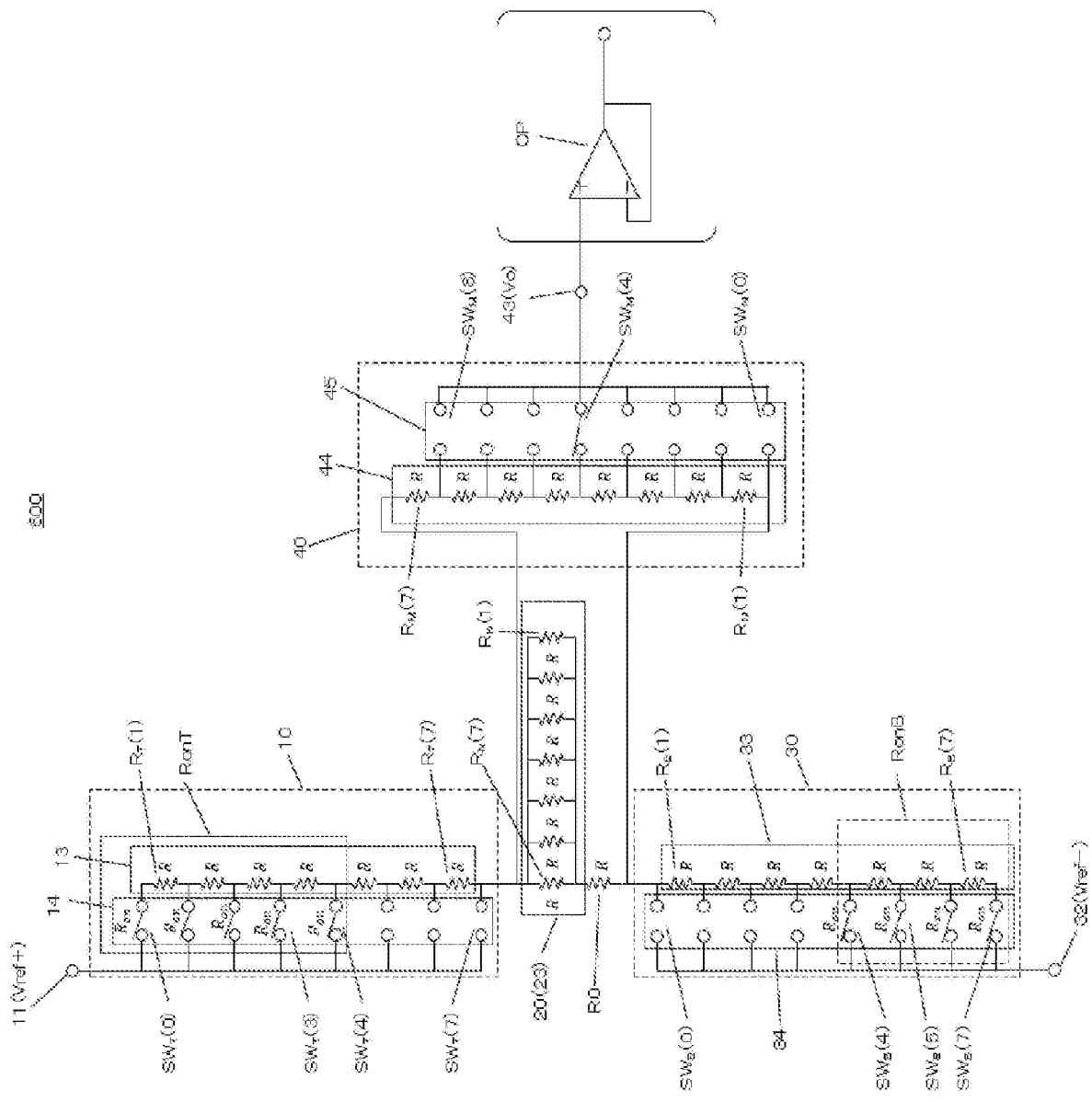
FIG. 16 is a circuit diagram of a digital-to-analog converter according to a fifth exemplary embodiment.

FIG. 16 is a circuit diagram of a digital-to-analog converter 600 according to the fifth embodiment. The digital-to-analog converter 600 is a modified example of the digital-to-analog converter 100 according to the first embodiment (see FIG. 1). The digital-to-analog converter 600 has the same circuit configuration as the digital-to-analog converter 100 and is different from the digital-to-analog converter 100 only in a connection pattern of the switches when a digital signal is input thereto. In the following description, any constituent element of the digital-to-analog converter 600, having the same function as a counterpart of the digital-to-analog converter 100 described above, will be designated by the same reference sign as the counterpart's and description thereof will be simplified.

The digital-to-analog converter 600 according to the fifth embodiment, as well as the digital-to-analog converter 100, includes the first partial circuit 10, the second partial circuit 20, the third partial circuit 30, the fourth partial circuit 40, and the first resistor R0.

Supposing the three most significant bits, used for coarse adjustment, out of a 6-bit digital value is q, the digital-to-analog converter 600 controls the switches of the first partial circuit 10 (the first bank of resistors 13) and the third partial circuit 30 (third bank of resistors 33) so as to turn ON all switches that have a value equal to or less than the digital value q.

In other words, in the first partial circuit 10, when a digital signal is input, a node specified by the digital signal and another node located outside of the former node are electrically connected to the first terminal 11, out of $2^m$ nodes that the first bank of resistors 13 has. In the third partial circuit 30, a node specified by the digital signal and another node located outside of the former node are electrically connected to the eighth terminal 32, out of $2^m$ nodes that the third bank of resistors 33 has.

Note that one side, electrically connected to the second partial circuit 20, of the first bank of resistors 13 (i.e., one side with the second terminal 12) is defined herein to be "the inside" and the other side, located opposite from the second partial circuit 20, of the first bank of resistors 13 (i.e., the other side with the first terminal 11) is defined herein to be "the outside." That is to say, in the first bank of resistors 13, one side with the resistor $R_T(2^m-1)$ is the inside, and the other side with the resistor $R_T(1)$ is the outside (see FIG. 1). Likewise, in the third bank of resistors 33, one side electrically connected to the second partial circuit 20 (i.e., the side with the seventh terminal 31) is defined to be the inside, and the other side located opposite from the second partial circuit 20 (i.e., the side with the eighth terminal 32) is defined to be the outside. That is to say, in the third bank of resistors 33, one side with the resistor $R_B(1)$ is defined to be the inside, and the other side with the resistor $R_B(2^m-1)$ is defined to be the outside (see FIG. 1).

More specifically, in the digital-to-analog converter 600, in response to a digital signal represented by a 6-bit binary number $[100100]_2$, one of the $2^m$ nodes of the first bank of resistors 13 is electrically connected to the first terminal 11 by turning the switch $SW_T(4)$ ON. In addition, another node, located outside of the node to which the switch $SW_T(4)$ is electrically connected, out of the $2^m$ nodes of the first bank of resistors 13 is also electrically connected to the first terminal 11 when the switches $SW_T(3)$ to $SW_T(0)$ are turned ON.

In addition, in response to a digital signal represented by a 6-bit binary number $[100100]_2$, one of the $2^m$ nodes of the third bank of resistors 33 is electrically connected to the eighth terminal 32 by turning the switch $SW_B(4)$ ON. In addition, another node, located outside of the node to which the switch $SW_B(4)$ is electrically connected, out of the $2^m$ nodes of the third bank of resistors 33 is also electrically connected to the eighth terminal 32 when the switches $SW_B(5)$ to $SW_B(7)$ are turned ON.

In this switch control, the combined resistance of the ON-state resistance of any of the switches that has been turned ON among the first group of switches 14 (i.e., the switches $SW_T(3)$ to $SW_T(0)$ shown in FIG. 16) and the resistance of a resistor located outside of the node connected in accordance with the digital value (i.e., the resistors $R_T(1)$ to $R_T(3)$ shown in FIG. 16) is designated by RonT. In addition, the combined resistance of the ON-state resistance of any of the switches that has been turned ON among the third bank of resistors 33 (i.e., the switches $SW_B(5)$ to $SW_B(7)$ shown in FIG. 16) and the resistance of a resistor located outside of the node connected in accordance with the digital value (i.e., the resistors $R_B(5)$ to $R_B(7)$ shown in FIG. 16) is designated by RonB. In that case, the combined resistance RonT is given by the following Equation (20) and the combined resistance RonB is given by the following Equation (21):

[Equation 20]

$$RonT \leq Ron \qquad (20)$$

[Equation 21]

$$RonB \leq Ron \qquad (21)$$

Thus, supposing the 6-bit digital value is designated by P in FIG. 16, the output voltage Vo is given by the following Equation (22):

[Equation 22]
$$V_o = p \times \frac{Vref^+}{64} + \left(1 - \frac{2p}{64}\right) \times \frac{8R_{onB}}{64R + 8R_{onT} + 8R_{onB}} \times \frac{Vref^+}{64} \quad (22)$$

Therefore, the integral nonlinearity error INL is given by the following Equation (23):

[Equation 23]
$$INL = \left(1 - \frac{2p}{64}\right) \times \frac{8R_{onB}}{64R + 8R_{onT} + 8R_{onB}} \times \frac{Vref^+}{64} \quad (23)$$

As can be seen, the output voltage Vo and the integral nonlinearity error INL may have their error component reduced, thus further improving the DAC performance, compared to the digital-to-analog converter 100 according to the first embodiment.

In addition, each of the switches $SW_T(0)$ to $SW_T(2^m-1)$ of the first group of switches 14 may be implemented as a p-channel transistor, and each of the switches $SW_B(0)$ to $SW_B(2^m-1)$ of the third group of switches 34 may be implemented as an n-channel transistor. This cuts down the number of transistors to a half, compared to a normal CMOS switch in which p-channel transistors and n-channel transistors are connected together in parallel. This reduces the number of parts and chip area required for the digital-to-analog converter 600, thus further cutting down the cost.

Sixth Embodiment

Next, a digital-to-analog converter 700 according to a sixth exemplary embodiment will be described.

Figure 17:
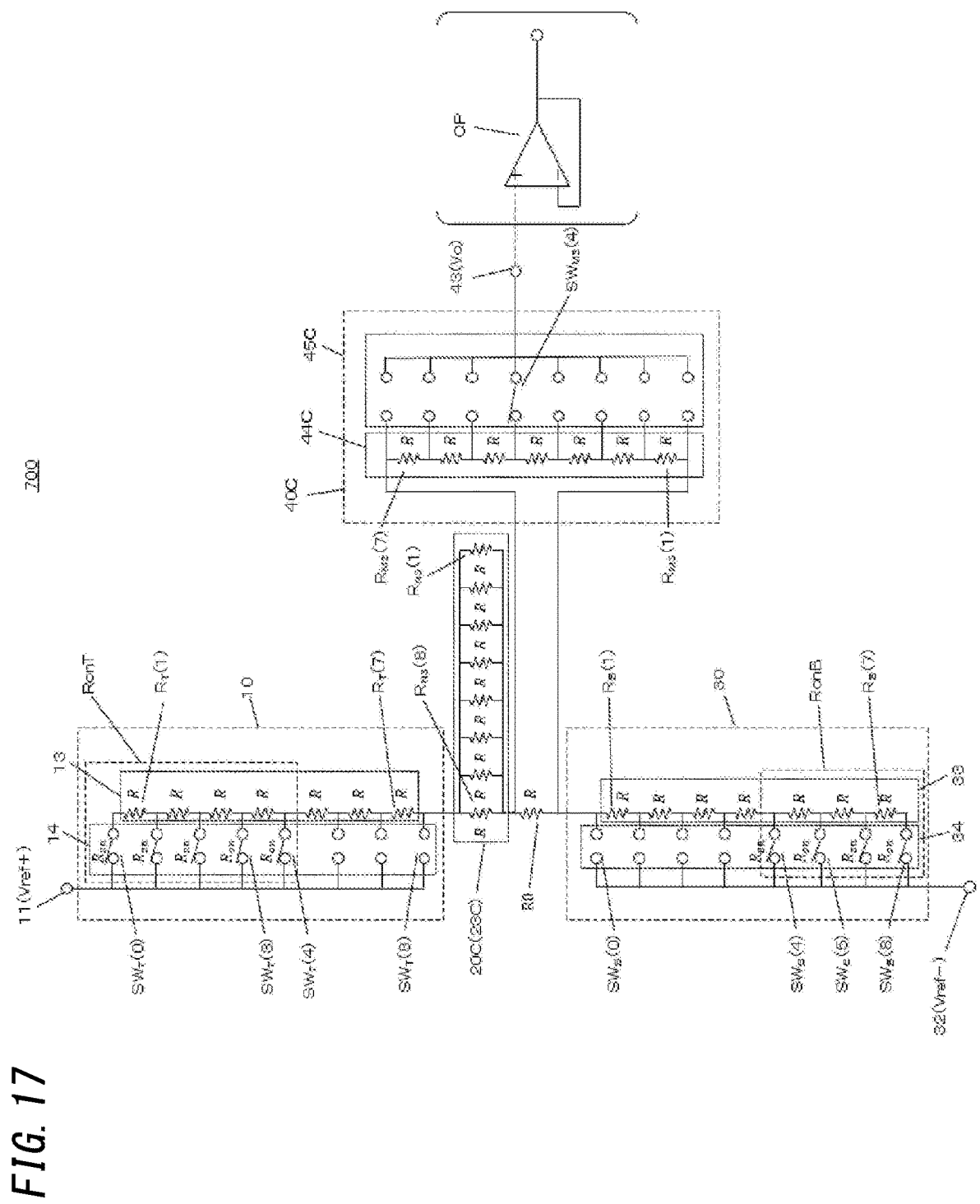
FIG. 17 is a circuit diagram of a digital-to-analog converter according to a sixth exemplary embodiment.

FIG. 17 is a circuit diagram of a digital-to-analog converter 700 according to the sixth embodiment. The digital-to-analog converter 700 is a modified example of the digital-to-analog converter 400 according to the third embodiment (see FIG. 13). The digital-to-analog converter 700 has the same circuit configuration as the digital-to-analog converter 400 and is different from the digital-to-analog converter 400 only in a connection pattern of the switches when a digital signal is input thereto. In the following description, any constituent element of the digital-to-analog converter 700, having the same function as a counterpart of the digital-to-analog converter 400 described above, will be designated by the same reference sign as the counterpart's and description thereof will be simplified.

The digital-to-analog converter 700 according to the sixth embodiment, as well as the digital-to-analog converter 400, includes the first partial circuit 10, the second partial circuit 20C, the third partial circuit 30, the fourth partial circuit 40C, and the first resistor R0.

Supposing the three most significant bits, used for coarse adjustment, out of a 6-bit digital value is q, the digital-to-analog converter 700 controls the switches of the first partial circuit 10 (the first bank of resistors 13) and the third partial circuit 30 (third bank of resistors 33) so as to turn ON all switches that have a value equal to or less than the digital value q.

In other words, in the first partial circuit 10, when a digital signal is input, a node specified by the digital signal and another node located outside of the former node are electrically connected to the first terminal 11, out of $2^m$ nodes that the first bank of resistors 13 has. In the third partial circuit 30, a node specified by the digital signal and another node located outside of the former node are electrically connected to the eighth terminal 32, out of $2^m$ nodes that the third bank of resistors 33 has.

Note that one side, electrically connected to the second partial circuit 20, of the first bank of resistors 13 (i.e., one side with the second terminal 12) is defined herein to be "the inside" and the other side, located opposite from the second partial circuit 20, of the first bank of resistors 13 (i.e., the other side with the first terminal) is defined herein to be "the outside." That is to say, in the first bank of resistors 13, one side with the resistor $R_T(2^m-1)$ is the inside, and the other side with the resistor $R_T(1)$ is the outside (see FIG. 13). Likewise, in the third bank of resistors 33, one side electrically connected to the second partial circuit 20 (i.e., the side with the seventh terminal 31) is defined to be the inside, and the other side located opposite from the second partial circuit 20 (i.e., the side with the eighth terminal 32) is defined to be the outside. That is to say, in the third bank of resistors 33, one side with the resistor $R_B(1)$ is defined to be the inside, and the other side with the resistor $R_B(2^m-1)$ is defined to be the outside (see FIG. 13).

More specifically, in the digital-to-analog converter 700, in response to a digital signal represented by a 6-bit binary number $[100100]_2$, one of the $2^m$ nodes of the first bank of resistors 13 is electrically connected to the first terminal 11 by turning the switch $SW_T(4)$ ON. In addition, another node, located outside of the node to which the switch $SW_T(4)$ is electrically connected, out of the $2^m$ nodes of the first bank of resistors 13 is also electrically connected to the first terminal 11 when the switches $SW_T(3)$ to $SW_T(0)$ are turned ON.

In addition, in response to a digital signal represented by a 6-bit binary number $[100100]_2$, one of the $2^m$ nodes of the third bank of resistors 33 is electrically connected to the eighth terminal 32 by turning the switch $SW_B(4)$ ON. In addition, another node, located outside of the node to which the switch $SW_B(4)$ is electrically connected, out of the $2^m$ nodes of the third bank of resistors 33 is also electrically connected to the eighth terminal 32 when the switches $SW_B(5)$ to $SW_B(7)$ are turned ON.

In this switch control, the combined resistance of the ON-state resistance of any of the switches that has been turned ON among the first group of switches 14 (i.e., the switches $SW_T(3)$ to $SW_T(0)$ shown in FIG. 17) and the resistance of a resistor located outside of the node connected in accordance with the digital value (i.e., the resistors $R_T(1)$ to $R_T(3)$ shown in FIG. 17) is designated by RonT. In addition, the combined resistance of the ON-state resistance of any of the switches that has been turned ON among the third bank of resistors 33 (i.e., the switches $SW_B(5)$ to $SW_B(7)$ shown in FIG. 17) and the resistance of a resistor located outside of the node connected in accordance with the digital value (i.e., the resistors $R_B(5)$ to $R_B(7)$ shown in FIG. 17) is designated by RonB. In that case, the combined resistance RonT is given by the Equation (20) and the combined resistance RonB is given by the Equation (21). These relationships are the same as in the digital-to-analog converter 600 according to the fifth embodiment.

Thus, the output voltage Vo is given by Equation (22) and the integral nonlinearity error INL is given by Equation (23).

These relationships are also the same as in the digital-to-analog converter 600 according to the fifth embodiment.

As can be seen, the digital-to-analog converter 700 according to the sixth embodiment, as well as the digital-to-analog converter 600 according to the fifth embodiment, also reduces the error component, thus further improving the DAC performance, compared to the digital-to-analog converter 400 according to the third embodiment.

In the foregoing description of embodiments, the digital-to-analog converter according to the present disclosure is implemented as a 6-bit digital-to-analog converter. However, this is only an example and should not be construed as limiting. Alternatively, even when the digital-to-analog converter according to the present disclosure is implemented as an n-bit digital-to-analog converter, the same advantages as the ones described above may also be achieved by satisfying the relationship that uses n and m described above.

(Resume)

A digital-to-analog converter (100, 300, 600) according to a first aspect is implemented as a digital-to-analog converter of n bits including m bits for fine adjustment where m is a positive integer and n is an integer larger than m. The digital-to-analog converter (100, 300, 600) includes a first partial circuit (10), a second partial circuit (20, 20B), a first resistor (R0), a third partial circuit (30), and a fourth partial circuit (40).

The first partial circuit (10) has a first terminal (11) and a second terminal (12). A high-side reference potential (Vref+) is applied to the first terminal (11). The second partial circuit (20, 20B) has a third terminal (21) and a fourth terminal (22). The third terminal (21) is electrically connected to the second terminal (12). The first resistor (R0) has a fifth terminal (51) and a sixth terminal (52). The fifth terminal (51) is electrically connected to the fourth terminal (22). The third partial circuit (30) has a seventh terminal (31) and an eighth terminal (32). The seventh terminal (31) is electrically connected to the sixth terminal (52). A low-side reference potential (Vref−) is applied to the eighth terminal (32). The fourth partial circuit (40) has a ninth terminal (41), a tenth terminal (42), and an eleventh terminal (43). The ninth terminal (41) is electrically connected to the third terminal (21). The tenth terminal (42) is electrically connected to the sixth terminal (52). An analog signal is output through the eleventh terminal (43).

The fourth partial circuit (40) includes a fourth bank of resistors (44) and a fourth group of switches (45). The fourth bank of resistors (44) is constituted of $2^{(n-m)}$ resistors ($R_M$) that are connected together in series between the ninth terminal (41) and the tenth terminal (42). The fourth group of switches (45) is constituted of $2^{(n-m)}$ switches ($SW_M$) configured to electrically connect every node of the fourth bank of resistors (44), but a node located closer to the ninth terminal (41) than any other node of the fourth bank of resistors (44), to the eleventh terminal (43) in response to a digital signal.

The first partial circuit (10) includes a first bank of resistors (13) and a first group of switches (14). The first bank of resistors (13) is constituted of $2^m-1$ resistors ($R_T$) that are connected together in series between the first terminal (11) and the second terminal (12). The first group of switches (14) is constituted of $2^m$ switches ($SW_T$) configured to electrically connect $2^m$ nodes of the first bank of resistors (13) to the first terminal (11) in response to the digital signal.

The third partial circuit (30) includes a third bank of resistors (33) and a third group of switches (34). The third bank of resistors (33) is constituted of $2^m-1$ resistors ($R_B$) that are connected together in series between the seventh terminal (31) and the eighth terminal (32). The third group of switches (34) is constituted of $2^m$ switches ($SW_B$) configured to electrically connect $2^m$ nodes of the third bank of resistors (33) to the eighth terminal (32) in response to the digital signal.

When the first resistor (R0) has a resistance value R, the fourth bank of resistors (44) has a combined resistance value of $2^{(n-m)}R$, the first bank of resistors (13) has a combined resistance value of $(2^m-1)R$, the third bank of resistors (33) has a combined resistance value of $(2^m-1)R$, and the second partial circuit (20, 20B) has a combined resistance value of $R/(2^{(n-m)}-1)$.

In a digital-to-analog converter (100, 600) according to a second aspect, which may be implemented in conjunction with the first aspect, the second partial circuit (20) includes a second bank of resistors (23) electrically connected between the third terminal (21) and the fourth terminal (22). The second bank of resistors (23) is constituted of $2^{(n-m)}-1$ resistors ($R_N$) that are connected together in parallel.

In a digital-to-analog converter (100, 600) according to a third aspect, which may be implemented in conjunction with the second aspect, all of the resistors forming the second, third, and fourth banks of resistors (23, 33, 44) have the same resistance value as the first resistor (R0).

In a digital-to-analog converter (300) according to a fourth aspect, which may be implemented in conjunction with the first aspect, the second partial circuit (20B) includes a second bank of resistors (23B) electrically connected between the third terminal (21) and the fourth terminal (22), and the second bank of resistors (23B) is constituted of a single resistor ($R_{N2}$).

A digital-to-analog converter (400, 500, 700) according to a fifth aspect is implemented as a digital-to-analog converter of n bits including m bits for fine adjustment where m is a positive integer and n is an integer larger than m. The digital-to-analog converter (400, 500, 700) includes a first partial circuit (10), a second partial circuit (20C, 20D), a first resistor (R0), a third partial circuit (30), and a fourth partial circuit (40C).

The first partial circuit (10) has a first terminal (11) and a second terminal (12). A high-side reference potential (Vref+) is applied to the first terminal (11). The second partial circuit (20C, 20D) has a third terminal (21) and a fourth terminal (22). The third terminal (21) is electrically connected to the second terminal (12). The first resistor (R0) has a fifth terminal (51) and a sixth terminal (52). The fifth terminal (51) is electrically connected to the fourth terminal (22). The third partial circuit (30) has a seventh terminal (31) and an eighth terminal (32). The seventh terminal (31) is electrically connected to the sixth terminal (52). A low-side reference potential (Vref−) is applied to the eighth terminal (32). The fourth partial circuit (40C) has a ninth terminal (41), a tenth terminal (42), and an eleventh terminal (43). The ninth terminal (41) is electrically connected to the fifth terminal (51). The tenth terminal (42) is electrically connected to the sixth terminal (52). An analog signal is output through the eleventh terminal (43).

The fourth partial circuit (40C) includes a fourth bank of resistors (44C) and a fourth group of switches (45C). The fourth bank of resistors (44C) is constituted of $2^{(n-m)}-1$ resistors ($R_{M3}$) that are connected together in series between the ninth terminal (41) and the tenth terminal (42). The fourth group of switches (45C) is constituted of $2^{(n-m)}$ switches ($SW_{M3}$) configured to electrically connect $2^{(n-m)}$ nodes of the fourth bank of resistors (44C) to the eleventh terminal (43) in response to a digital signal.

The first partial circuit (10) includes a first bank of resistors (13) and a first group of switches (14). The first bank of resistors (13) is constituted of $2^m-1$ resistors ($R_T$) that are connected together in series between the first terminal (11) and the second terminal (12). The first group of switches (14) is constituted of $2^m$ switches ($SW_T$) configured to electrically connect $2^m$ nodes of the first bank of resistors (13) to the first terminal (11) in response to the digital signal.

The third partial circuit (30) includes a third bank of resistors (33) and a third group of switches (34). The third bank of resistors (33) is constituted of $2^m-1$ resistors ($R_B$) that are connected together in series between the seventh terminal (31) and the eighth terminal (32). The third group of switches (34) is constituted of $2^m$ switches ($SW_B$) configured to electrically connect $2^m$ nodes of the third bank of resistors (33) to the eighth terminal (32) in response to the digital signal.

When the first resistor (R0) has a resistance value R, the fourth bank of resistors (44C) has a combined resistance value of $(2^{(n-m)}-1)R$, the first bank of resistors (13) has a combined resistance value of $(2^m-1)R$, the third bank of resistors (33) has a combined resistance value of $(2^m-1)R$, and the second partial circuit (20C, 20D) has a combined resistance value of $R/(2^{(n-m)})$.

In a digital-to-analog converter (400, 700) according to a sixth aspect, which may be implemented in conjunction with the fifth aspect, the second partial circuit (20C) includes a second bank of resistors (23C) electrically connected between the third terminal (21) and the fourth terminal (22), and the second bank of resistors (23C) is constituted of $2^{(n-m)}$ resistors ($R_{N3}$) that are connected together in parallel.

In a digital-to-analog converter (400, 700) according to a seventh aspect, which may be implemented in conjunction with the sixth aspect, all of the resistors forming the second, third, and fourth banks of resistors (23C, 33, 44C) have the same resistance value as the first resistor (R0).

In a digital-to-analog converter (500) according to an eighth aspect, which may be implemented in conjunction with the fifth aspect, the second partial circuit (20D) includes a second bank of resistors (23D) electrically connected between the third terminal (21) and the fourth terminal (22), and the second bank of resistors (23D) is constituted of a single resistor ($R_{N4}$).

In a digital-to-analog converter (400, 500, 700) according to a ninth aspect, which may be implemented in conjunction with any one of the first to eighth aspects, the first group of switches (14) is configured to electrically connect, to the first terminal (11), a particular node, specified by the digital signal input, among the $2^m$ nodes of the first bank of resistors (13) and another node, located opposite from the second partial circuit (20C, 20D) with respect to the particular node, among the $2^m$ nodes of the first bank of resistors (13). The third group of switches (34) is configured to electrically connect, to the eighth terminal (32), a particular node, specified by the digital signal input, among the $2^m$ nodes of the third bank of resistors (33) and another node, located opposite from the second partial circuit (20C, 20D) with respect to the particular node, among the $2^m$ nodes of the third bank of resistors (33).

In a digital-to-analog converter (100, 300, 400, 500, 600, 700) according to a tenth aspect, which may be implemented in conjunction with any one of the first to ninth aspects, each of the switches that form the first group of switches (14) is implemented as a p-channel transistor, and each of the switches that form the third group of switches (34) is implemented as an n-channel transistor.

INDUSTRIAL APPLICABILITY

The present disclosure contributes to improving the performance of digital-to-analog converters, and therefore, is effectively applicable to various types of sensors, for example.

REFERENCE SIGNS LIST 100, 300, 400, 500, 600, 700 Digital-to-Analog Converter
10 First Partial Circuit
11 First Terminal
12 Second Terminal
13 First Bank of Resistors
14 First Group of Switches
$SW_T$ Switch
$R_T$ Resistor
20, 20B, 20C, 20D Second Partial Circuit
21 Third Terminal
22 Fourth Terminal
23, 23B, 23C, 23D Second Bank of Resistors
$R_N$, $R_{N2}$, $R_{N3}$, $R_{N4}$ Resistor
30 Third Partial Circuit
31 Seventh Terminal
32 Eighth Terminal
33 Third Bank of Resistors
34 Third Group of Switches
$SW_B$ Switch
$R_B$ Resistor
40, 40C Fourth Partial Circuit
41 Ninth terminal
42 Tenth Terminal
43 Eleventh Terminal
44, 44C Fourth Bank of Resistors
45, 45C Fourth Group of Switches
$SW_M$, $SW_{M3}$ Switch
$R_M$, $R_{M3}$ Resistor
R0 First Resistor
51 Fifth Terminal
52 Sixth Terminal
Vref+ High-Side Reference Potential
Vref− Low-Side Reference Potential

The invention claimed is:

1. A digital-to-analog converter of n bits including m bits for fine adjustment where m is a positive integer and n is an integer larger than m, the digital-to-analog converter comprising:
  a first partial circuit having a first terminal and a second terminal, a high-side reference potential being applied to the first terminal;
  a second partial circuit having a third terminal and a fourth terminal, the third terminal being electrically connected to the second terminal;
  a first resistor having a fifth terminal and a sixth terminal, the fifth terminal being electrically connected to the fourth terminal;
  a third partial circuit having a seventh terminal and an eighth terminal, the seventh terminal being electrically connected to the sixth terminal, a low-side reference potential being applied to the eighth terminal; and
  a fourth partial circuit having a ninth terminal, a tenth terminal, and an eleventh terminal, the ninth terminal being electrically connected to the third terminal, the tenth terminal being electrically connected to the sixth terminal, an analog signal being output through the eleventh terminal, the fourth partial circuit including:
a fourth bank of resistors comprised of $2^{(n-m)}$ resistors that are connected together in series between the ninth terminal and the tenth terminal; and
a fourth group of switches comprised of $2^{(n-m)}$ switches each being configured to electrically connect a specified one of nodes of the fourth bank of resistors, except a node located closer to the ninth terminal than any other one of the nodes of the fourth bank of resistors, to the eleventh terminal in response to a digital signal,
the first partial circuit including:
a first bank of resistors comprised of $2^m-1$ resistors that are connected together in series between the first terminal and the second terminal; and
a first group of switches comprised of $2^m$ switches configured to electrically connect $2^m$ nodes of the first bank of resistors to the first terminal in response to the digital signal,
the third partial circuit including:
a third bank of resistors comprised of $2^m-1$ resistors that are connected together in series between the seventh terminal and the eighth terminal; and
a third group of switches comprised of $2^m$ switches configured to electrically connect $2^m$ nodes of the third bank of resistors to the eighth terminal in response to the digital signal, wherein
when the first resistor has a resistance value R,
the fourth bank of resistors has a combined resistance value of $2^{(n-m)}R$,
the first bank of resistors has a combined resistance value of $(2^m-1)R$,
the third bank of resistors has a combined resistance value of $(2^m-1)R$, and
the second partial circuit has a combined resistance value of $R/(2^{(n-m)}-1)$.

2. The digital-to-analog converter of claim 1, wherein
the second partial circuit includes a second bank of resistors electrically connected between the third terminal and the fourth terminal, and
the second bank of resistors is comprised of $2^{(n-m)}-1$ resistors that are connected together in parallel.

3. The digital-to-analog converter of claim 2, wherein all of the resistors forming the second, third, and fourth banks of resistors have the same resistance value as the first resistor.

4. The digital-to-analog converter of claim 1, wherein
the second partial circuit includes a second bank of resistors electrically connected between the third terminal and the fourth terminal, and
the second bank of resistors is comprised of a single resistor.

5. The digital-to-analog converter of claim 1, wherein
the first group of switches is configured to electrically connect, to the first terminal,
a particular node, specified by the digital signal input, among the $2^m$ nodes of the first bank of resistors and another node, located opposite from the second partial circuit with respect to the particular node, among the $2^m$ nodes of the first bank of resistors
and
the third group of switches is configured to electrically connect, to the eighth terminal,
a particular node, specified by the digital signal input, among the $2^m$ nodes of the third bank of resistors and another node, located opposite from the second partial circuit with respect to the particular node, among the $2^m$ nodes of the third bank of resistors.

6. The digital-to-analog converter of claim 1, wherein
each of the switches that form the first group of switches is implemented as a p-channel transistor, and
each of the switches that form the third group of switches is implemented as an n-channel transistor.

7. A digital-to-analog converter of n bits including m bits for fine adjustment where m is a positive integer and n is an integer larger than m, the digital-to-analog converter comprising:
a first partial circuit having a first terminal and a second terminal, a high-side reference potential being applied to the first terminal;
a second partial circuit having a third terminal and a fourth terminal, the third terminal being electrically connected to the second terminal;
a first resistor having a fifth terminal and a sixth terminal, the fifth terminal being electrically connected to the fourth terminal;
a third partial circuit having a seventh terminal and an eighth terminal, the seventh terminal being electrically connected to the sixth terminal, a low-side reference potential being applied to the eighth terminal; and
a fourth partial circuit having a ninth terminal, a tenth terminal, and an eleventh terminal, the ninth terminal being electrically connected to the fifth terminal, the tenth terminal being electrically connected to the sixth terminal, an analog signal being output through the eleventh terminal,
the fourth partial circuit including:
a fourth bank of resistors comprised of $2^{(n-m)}-1$ resistors that are connected together in series between the ninth terminal and the tenth terminal; and
a fourth group of switches comprised of $2^{(n-m)}$ switches configured to electrically connect $2^{(n-m)}$ nodes of the fourth bank of resistors to the eleventh terminal in response to a digital signal,
the first partial circuit including:
a first bank of resistors comprised of $2^m-1$ resistors that are connected together in series between the first terminal and the second terminal; and
a first group of switches comprised of $2^m$ switches configured to electrically connect $2^m$ nodes of the first bank of resistors to the first terminal in response to the digital signal,
the third partial circuit including:
a third bank of resistors comprised of $2^m-1$ resistors that are connected together in series between the seventh terminal and the eighth terminal; and
a third group of switches comprised of $2^m$ switches configured to electrically connect $2^m$ nodes of the third bank of resistors to the eighth terminal in response to the digital signal, wherein
when the first resistor has a resistance value R,
the fourth bank of resistors has a combined resistance value of $(2^{(n-m)}-1)R$,
the first bank of resistors has a combined resistance value of $(2^m-1)R$,
the third bank of resistors has a combined resistance value of $(2^m-1)R$, and
the second partial circuit has a combined resistance value of $R/(2^{(n-m)})$.

8. The digital-to-analog converter of claim 7, wherein
the second partial circuit includes a second bank of resistors electrically connected between the third terminal and the fourth terminal, and
the second bank of resistors is comprised of $2^{(n-m)}$ resistors that are connected together in parallel.

9. The digital-to-analog converter of claim 8, wherein
all of the resistors forming the second, third, and fourth banks of resistors have the same resistance value as the first resistor.

10. The digital-to-analog converter of claim 7, wherein
the second partial circuit includes a second bank of resistors electrically connected between the third terminal and the fourth terminal, and
the second bank of resistors is comprised of a single resistor.

11. The digital-to-analog converter of claim 7, wherein
the first group of switches is configured to electrically connect, to the first terminal, a particular node, specified by the digital signal input, among the 2m nodes of the first bank of resistors and
another node, located opposite from the second partial circuit with respect to the particular node, among the 2m nodes of the first bank of resistors
and
the third group of switches is configured to electrically connect, to the eighth terminal, a particular node, specified by the digital signal input, among the 2m nodes of the third bank of resistors and
another node, located opposite from the second partial circuit with respect to the particular node, among the 2m nodes of the third bank of resistors.

12. The digital-to-analog converter of claim 7, wherein
each of the switches that form the first group of switches is implemented as a p-channel transistor, and
each of the switches that form the third group of switches is implemented as an n-channel transistor.

* * * * *